(12) United States Patent
Saito

(10) Patent No.: US 6,514,851 B2
(45) Date of Patent: Feb. 4, 2003

(54) METHOD OF FABRICATION OF MULTILAYER SEMICONDUCTOR WIRING STRUCTURE WITH REDUCED ALIGNMENT MARK AREA

(75) Inventor: Hirofumi Saito, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/877,179

(22) Filed: Jun. 11, 2001

(65) Prior Publication Data

US 2001/0050437 A1 Dec. 13, 2001

(30) Foreign Application Priority Data

Jun. 13, 2000 (JP) .......................................... 2000-176249

(51) Int. Cl.7 .......................................... H01L 21/4763
(52) U.S. Cl. ........................................ 438/622; 438/401
(58) Field of Search .................................. 257/758, 752, 257/797; 438/637, 401

(56) References Cited

U.S. PATENT DOCUMENTS

| 5,834,845 | A | * | 11/1998 | Stolmeijer | 257/752 |
| 5,933,744 | A | * | 8/1999 | Chen et al. | 438/401 |
| 5,976,971 | A | * | 11/1999 | Kinpara et al. | 438/637 |
| 6,261,918 | B1 | * | 7/2001 | So | 438/401 |
| 6,307,273 | B1 | * | 10/2001 | Chien et al. | 257/797 |

FOREIGN PATENT DOCUMENTS

JP  07066200 A  *  3/1995

* cited by examiner

*Primary Examiner*—David Nelms
*Assistant Examiner*—Thinh Nguyen
(74) *Attorney, Agent, or Firm*—McGinn & Gibb, PLLC

(57) ABSTRACT

When the through holes are formed in the first to the eighth insulation layers, an alignment is performed by using an alignment mark provided in the lowermost wiring layer. The alignment marks provided in the insulation layers are formed by being alternately overlapped in two areas of a scribe line having a saucer, thereby, the area occupied by the alignment marks is reduced.

17 Claims, 18 Drawing Sheets

DISTANCE

DISTANCE

METHOD OF FABRICATION OF MULTILAYER SEMICONDUCTOR WIRING STRUCTURE WITH REDUCED ALIGNMENT MARK AREA

BACKGROUND OF THE INVENTION

1. Technical Field of the Invention

The present invention relates to a semiconductor device and a method of manufacturing the same, and more particularly, relates to a semiconductor device that can reduce an area occupied by an alignment mark such as a scribe line formed in an alignment area and a method of manufacturing the same.

2. Description of the Related Art

A semiconductor device having a multilayer wiring structure is formed by means of stacking a plurality of insulation layers or wiring layers using a photolithography, but an alignment mark is used in positioning the patterns transferred by the photolithography with respect to each layer. The alignment marks have various shapes according to the exposing system, but, generally, are formed by means of arranging marks having angle of several μm in several to several tens of matrix shapes. The positioning of a semiconductor substrate is performed by means of exposing the alignment mark to a laser beam and detecting the reflected right thereof. Then, after a layer is formed, wiring and through holes are formed by means of performing process such as etching to the layer using a resist pattern to which a mask pattern is transferred.

In this case, a method of manufacturing a semiconductor device using the conventional alignment mark will be discussed with reference to FIGS. 1A through 1G (first prior art). FIGS. 1A through 1G are cross sectional views schematically and sequentially showing a forming method of an alignment mark in the manufacturing processes of the semiconductor device according to the first prior art, and illustrate cross sections of an alignment area such as a scribe line. Also, this prior art shows only an alignment area, and does not show a circuit pattern area where transistor and the like are formed.

First, predetermined transistor, etc. are formed (not shown) in a circuit pattern area of a semiconductor substrate such as Si (not shown). Next, as shown in FIG. 1A, a first insulation layer 1 comprised of a silicon oxide film, etc. is formed, and then, after a metal layer of Al, etc. is deposited, a resist layer is formed, and then, an alignment is performed by using a mark (not shown) previously formed on the semiconductor substrate which becomes a base as a reference, after that, the resist layer is exposed. And, process such as a dry etching is carried out by using a resist pattern formed by the exposure as a mask, so that a first wiring layer is formed in the circuit pattern area, and at the same time, an alignment mark 2a comprised of the same metal layer as the first wiring layer is formed in the alignment area such as the scribe line. Further, the alignment mark explained in the prior art is comprised of about several tens of rows with three columns of marks arranged at predetermined intervals, and the cross section of a line direction will be explained.

Next, after a second insulation layer 3 is deposited on the first wiring layer, a resist layer is formed, and an exposure is carried out by means of using the alignment mark 2a as a reference. And, a dry etching process is performed by using a resist pattern formed by the exposure as a mask, so that first through holes are formed in the circuit pattern area, and at the same time, an alignment mark 3a in which the first through holes are arranged is formed in the alignment area.

In addition, the first through holes are formed on the first wiring layer in the circuit pattern area which is not shown, but because the first wiring layer is not formed under the second insulation layer 3 in the alignment area shown in FIG. 1A, the thickness of the second insulation layer 3 is thicker than that of the circuit pattern area. In this case, since the condition of the dry etching to form the through holes are set according to the thickness of the insulation layer in the circuit pattern area, the first through holes in the alignment area do not penetrate the second insulation layer 3, and have a shape that the etching is stopped in the middle portion of the second insulation layer 3.

Next, as shown FIG. 1B, after a metal layer such as Al is deposited on the second insulation layer 3, a predetermined resist layer (not shown) is formed, and then, a resist pattern (not shown) is formed by performing an alignment by using the alignment mark 3a depositing the metal layer as a reference. A dry etching process is performed by means of using the resist pattern as a mask, so that a second wiring layer 4 is formed in the circuit pattern area. In addition, as shown in FIG. 1C, an alignment mark 4a is formed in the alignment area.

Next, as shown in FIG. 1D, after a third insulation layer 5 is deposited on the second wiring layer 4, a predetermined resist layer (not shown) is formed, and then, an exposure is performed by using the alignment mark 4a formed of the second wiring layer 4 as a reference, so that a resist pattern (not shown) having a predetermined opening is formed. After that, a dry etching is performed by means of using the resist pattern as a mask, so that second through holes penetrating the third insulation layer 5 are formed in the circuit pattern area, and at the same time, an alignment mark 5a in which the second through holes are arranged is formed in the alignment area.

Next, as shown in FIG. 1E, after a metal layer such as Al is deposited on the third insulation layer 5, a predetermined resist layer is formed, and then, an alignment is performed by using the alignment mark 5a depositing the metal layer as a reference, so that a resist pattern (not shown) is formed. A dry etching process is performed by using the resist pattern as a mask, so that a third wiring layer 6 is formed in the circuit pattern area, and at the same time, as shown in FIG. 1F, an alignment mark 6a is formed in the alignment area. After that, a semiconductor device as shown in FIG. 1G in which a plurality of wiring layers (seven layers in this prior art) are stacked is manufactured by repeating the same processes sequentially.

As such, conventionally, when forming the patterns of each wiring layer 4, 6, an alignment is performed by using the alignment marks 3a, 5a comprised of the through holes of the insulation layers 3, 5 just under the wiring layers 4, 6, and alignment marks 4a, 6a comprised of a wiring metal are newly formed on the alignment area such as a scribe line, on the other hand, when forming the through holes in each insulation layer 3, 5, an alignment is performed by using the alignment marks 2a, 4a comprised of the wiring layers 2, 4 just under the insulation layers, and the alignment marks 3a, 5a comprised of the through holes are formed on the alignment area.

That is, in case of alternately stacking wiring layers and insulation layers, since new alignment marks are formed according to the formation of the wiring layers and the through holes in the insulation layers, the alignment marks having the same number as the sum of the deposited wiring layers and insulation layers are formed in a new place in the alignment area. In detail, in case where seven wiring layers are formed as shown in the present prior art, total fourteen alignment marks including the insulation layers are formed.

However, in the recent semiconductor devices having a multilayer wiring structure, because the number of alignment marks are increased by making in a multilayer form, and at the same time, more accurate alignment is demanded by minuteness, the arranged number of the marks constituting alignment mark are increased, and an area occupied by one alignment mark becomes great. On the other hand, since a shape of the alignment mark are determined by the used exposing system, the shape thereof cannot be changed freely, and the area occupied by the alignment mark in the alignment area such as a scribe line as a whole semiconductor device becomes great, and thus, there is a problem that other accessory or check pattern for confirming the operation of the semiconductor device cannot be inserted into the scribe line.

As a method of solving the problem, the official gazettes of Japanese Patent Laid-Open No. hei 9-232207, etc. describe the method of arranging the alignment marks formed in each insulation layer or metal layer such that they are overlapped with each other in a normal direction to a semiconductor substrate. The method will be explained below with reference to FIGS. 2A through 2G and FIG. 3. FIGS. 2A through 2G and FIG. 3 are improvement of the first prior art, are cross sectional views sequentially showing the second prior art to reduce an area occupied by an alignment mark, and illustrate only an alignment area similarly to the above-mentioned first prior art.

First, in the same manner as the above-mentioned first prior art, after predetermined transistor, etc. are formed on a semiconductor substrate (not shown) such as Si, as shown in FIG. 2A, a first insulation layer 1 comprised of a silicon oxide layer, etc. and a metal layer of Al, etc. are deposited. Next, a predetermined resist layer (not shown) is formed, and an exposure is performed by means of using a mark (not shown) previously formed on a predetermined position of the semiconductor substrate as a reference, so that a resist pattern is formed. And, a dry etching is performed by means of using the resist pattern as a mask, so that a first wiring layer is formed in a circuit pattern area, and at the same time, an alignment mark 2a in which the metal layer is arranged in a matrix shape is formed in a first area of an alignment area.

Next, after a second insulation layer 3 is deposited on the first wiring layer, a resist predetermined layer (not shown) is formed, and then, an exposure is performed by means of using the first alignment mark 2a as a reference. And, a dry etching is performed by using a resist pattern (not shown) formed by the exposure as a mask, so that first through holes penetrating the second insulation layer 3 are formed in the circuit pattern area, and at the same time, an alignment mark 3a in which the first through holes are arranged in a matrix shape is formed in a second area of the alignment area. In addition, the reason why the alignment mark 3a does not penetrate the second insulation layer 3 and etching is stopped in the middle portion of the second insulation layer 3 is the same as that of the above-mentioned first prior art.

Next, as shown in FIGS. 2B and 2C, after a metal layer is deposited on the second insulation layer 3, a predetermined resist layer (not shown) is formed, and then, a resist pattern (not shown) is formed by performing an alignment by means of using the alignment mark 3a comprised of the first through holes formed in the previous process as a reference. And, a dry etching process is performed by using the resist pattern as a mask, however, in the second prior art, an alignment mark 4a comprised of the second wiring layer 4 is formed in a third area of the scribe line, and at the same time, a light-shielding layer 4d is formed in the upper part of the alignment mark 2a in the first area.

Next, as shown in FIG. 2D, after a third insulation layer 5 is deposited on the second wiring layer 4, a predetermined resist layer (not shown) is formed, and then, an exposure is performed by using the alignment mark 4a as a reference, so that a resist pattern (not shown) having an opening is formed on the light-shielding layer 4d. After that, a dry etching is performed by means of using the resist pattern as a mask, so that second through holes penetrating the third insulation layer 5 are formed in the circuit pattern area, and an alignment mark 5a reaching the light-shielding layer 4d is formed in the first area of the alignment area.

Next, as shown in FIG. 2E and FIG. 2F, after a metal layer such as Al is deposited on the third insulation layer 5, a predetermined resist layer (not shown) is formed, and then, an alignment performed by using the alignment mark 5a comprised of the second through holes formed in the previous process as a reference, so that a resist pattern (not shown) is formed. And, a dry etching process is performed by using the resist pattern as a mask, so that an alignment mark 6a comprised of the third wiring layer 6 is formed in a fourth area of the alignment area, and at the same time, a light-shielding layer 6d is formed in the upper part of the alignment mark 4a in the third area.

Next, as shown in FIG. 2G, after a fourth insulation layer 7 is deposited on the third wiring layer 6, a predetermined resist layer (not shown) is formed, and then, an exposure is performed by using the alignment mark 6a in the fourth area as a reference, so that a resist pattern (not shown) having an opening is formed on the light-shielding layer 6d. After that, a dry etching is performed by means of using the resist pattern as a mask, so that an alignment mark 7a comprised of third through holes reaching the light-shielding layer 6d is formed in the third area where the light-shielding layer 6d is formed. After that, a semiconductor device shown in FIG. 3 can be manufactured by repeating the above-mentioned processes of FIGS. 2A through 2G.

In the method described in the above-mentioned second prior art, since other alignment marks 5a, 7a, 15a composed of the through holes via the light-shielding layers 4d, 6d, 14d are formed in the upper layer of the alignment marks 2a, 4a, 12a comprised of the wiring layer, a ratio occupied by the alignment mark can be reduced, but since it is necessary that the light-shielding layers are formed so as to cover the whole alignment marks and an alignment mark is formed by arranging several×several tens of marks, a large number of light-shielding layers having large area, concretely, a large number of light-shielding layers comprised of a metal layer having a size of about several tens of $\mu$m×several hundreds of $\mu$m are arranged in the alignment area.

SUMMARY OF THE INVENTION

An object of the present invention is to provide a semiconductor device that can reduce an area occupied by the alignment mark of a scribe line without separately providing a metal layer having a large size such as a light-shielding layer and a method of manufacturing the same.

According to one aspect of the present invention, there is provided a method of manufacturing a semiconductor device, wherein a multilayer wiring structure in which wiring layers and insulation layers are alternately stacked are formed, and an alignment of each layer is performed by using an alignment mark provided in a predetermined alignment area. Said method comprises the steps of: performing the alignment of said wiring layer with respect to said insulation layer by using an alignment mark formed of a plurality of through holes provided in said insulation layer just under said wiring layer, when forming said wiring layer; and performing the alignment of said insulation layer with respect to said wiring layer by using an alignment mark provided in the lowermost wiring layer, when forming the through holes in each of said insulation layers.

According to the present invention, it is preferred to form an underlay having a larger shape than that of said through holes, at the same step of forming said wiring layer, at a position which is aligned to each through hole of said alignment mark which should be formed in said insulation layer just above said wiring layer.

Also, when forming said wiring layer, an etching of said wiring layer may be performed so as to form a convex portion extended outwardly from an inner wall of said through hole on an upper edge of each through hole of said alignment mark formed in said insulation layer just under said wiring layer.

Further, according to the present invention, there may be provided the constitution that said alignment marks formed in each of said insulation layers are sequentially formed in two or three areas within said predetermined alignment area, and said alignment marks in each area are arranged so as to be overlapped with each other as seen in a normal direction to the substrate.

According to another aspect of the present invention, there is provided a semiconductor device having a multi-layer wiring structure in which wiring layers and insulation layers are alternately stacked, and an alignment of each layer is performed by using an alignment mark provided in a predetermined alignment area. Said semiconductor device comprises: alignment marks having through holes provided in said insulation layers, to be used in the alignment of said wiring layers with respect to said insulation layers; and an alignment mark provided in the lowermost wiring layer, to be used in the alignment of all of said insulation layers.

According to the present invention, it is preferred that an underlay is formed, at the same step of forming said wiring layer just under said insulation layer, in the lower part of each through hole of said alignment mark formed in each of said insulation layers. A shape of said underlay is larger than that of said through holes as seen in a normal direction to the substrate.

Also, a convex portion may be provided formed of the wiring layer just above said insulation layer and extended outwardly from an upper edge of said through hole of said alignment mark formed in each of said insulation layers.

Further, according to the present invention, said alignment marks formed in each of said insulation layers may be sequentially formed in two or three areas within said predetermined alignment area, and said alignment marks in each area may be arranged so as to be overlapped with each other as seen in a normal direction to the substrate.

According to the present invention, since through holes are formed in all the insulation layers deposited above the first wiring layer and in a polyimide layer which is an uppermost layer to be used as a protection layer of a semiconductor device by using an alignment mark which is formed with the first wiring layer, and alignment marks formed of the through holes are overlapped with each other, and the alignment marks are not formed in a new area when forming the through holes in the insulation layer, the area occupied by the alignment marks can be reduced, thereby, the chip size can be effectively utilized.

Further, according to the present invention, a saucer which becomes a underlay is formed in the lower area of the through holes, and an alignment mark is formed by means of penetrating the through holes up to the saucer, so that an uniformity of an alignment mark shape in a wafer surface can be improved, thereby, the effect that the pattern of the wiring layer on the through holes can be precisely formed is exhibited.

In addition, according to the present invention, since it is unnecessary to provide a light-shielding layer for preventing the light reflected from the alignment mark of the lower layer, occurrence of metal film pieces causing short in providing the semiconductor device can be prevented.

BRIEF DESCRIPTION OF THE DRAWINGS

The above objects, other objects, features and advantages of the present invention will be better understood from the following description taken in conjunction with the accompanying drawings, in which.

THE PREFERRED EMBODIMENTS OF THE INVENTION

Hereinafter, a semiconductor device and a method of manufacturing the same according to the embodiments of the present invention will be described in detail with reference to the accompanying drawings.

In a method of manufacturing a semiconductor device having a multilayer wiring structure according to the present invention, as one preferred embodiment, when forming through holes in the first to eighth insulation layers, an alignment is performed by using an alignment mark (2a in FIG. 10A and FIG. 10B) provided in a first wiring layer of the lowermost layer, and alignment marks (3a, 5a, 7a in FIG. 10A and FIG. 10B) provided in an insulation layer are formed by being alternately overlapped in two areas such as a scribe line, so that an area occupied by the alignment marks can be reduced.

In order to explain the above-mentioned preferred embodiment of the present invention in detail, the embodiments of the present invention will be described with reference to the accompanying drawings.

First Embodiment

Figure 1A:
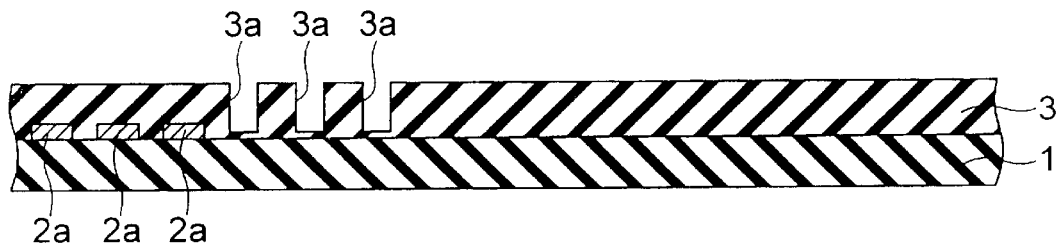
FIGS. 1A through 1G are cross sectional views sequentially showing a method of manufacturing a semiconductor device using an alignment mark according to the first prior art.
Figure 1B:
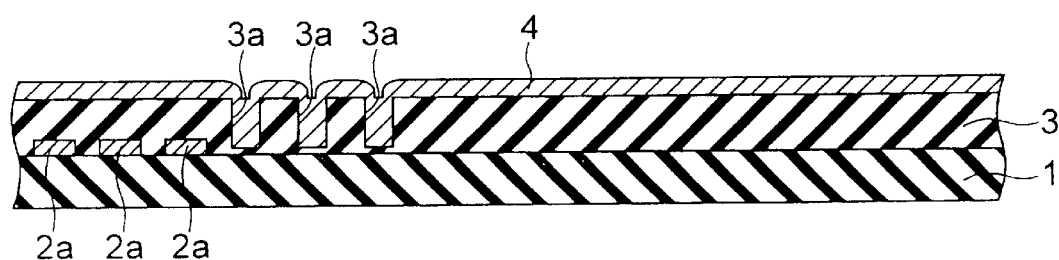
Figure 1C:
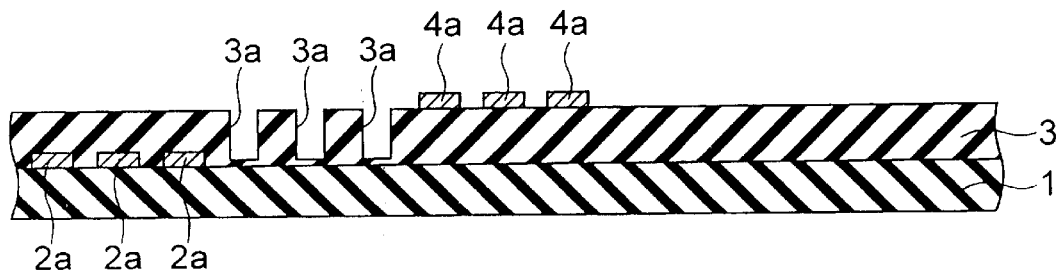
Figure 1D:
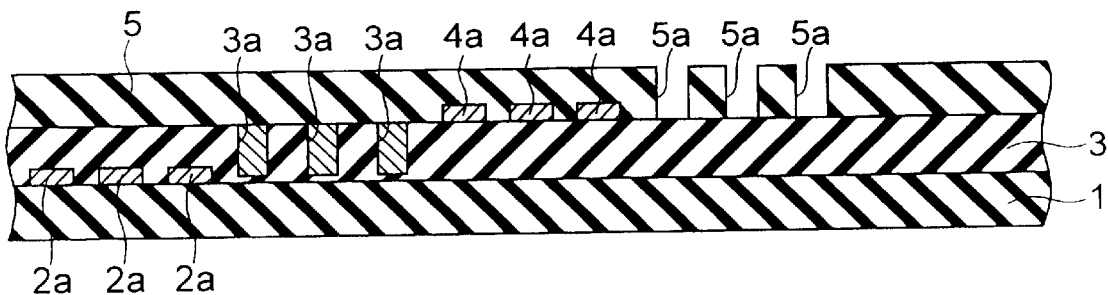
Figure 1E:
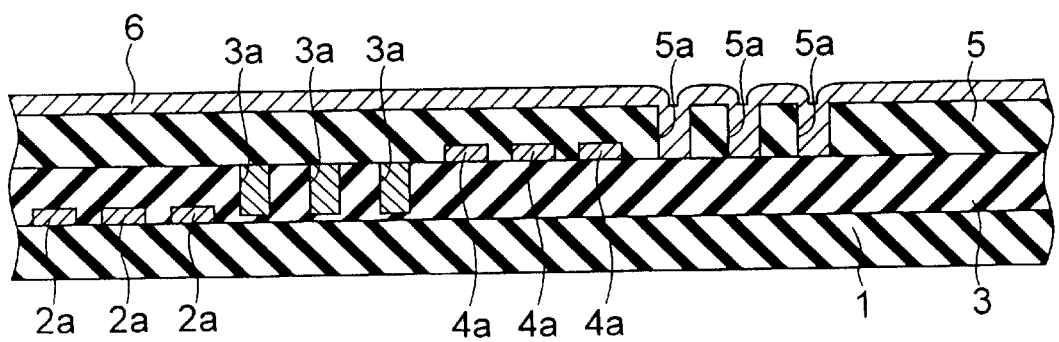
Figure 1F:
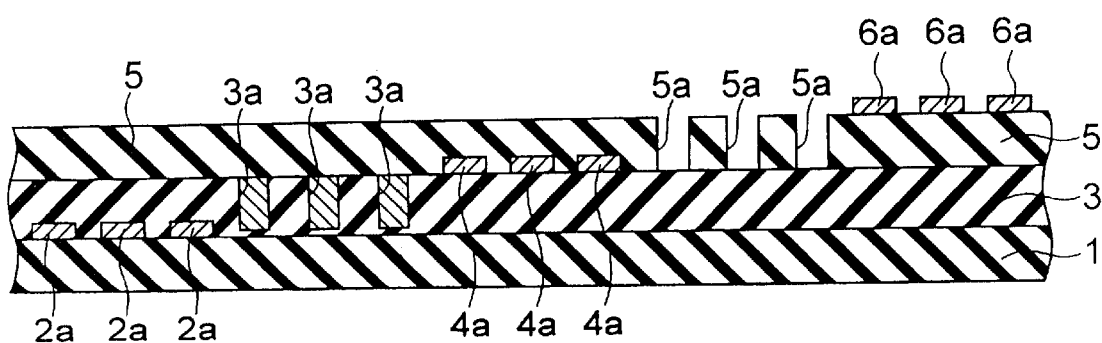
Figure 1G:
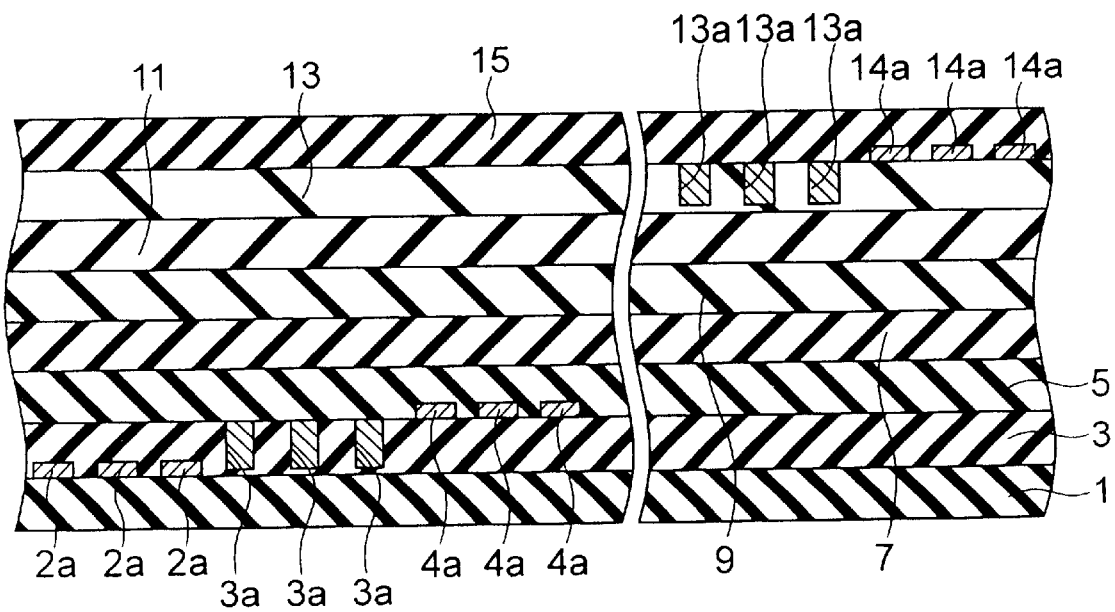
Figure 2A:
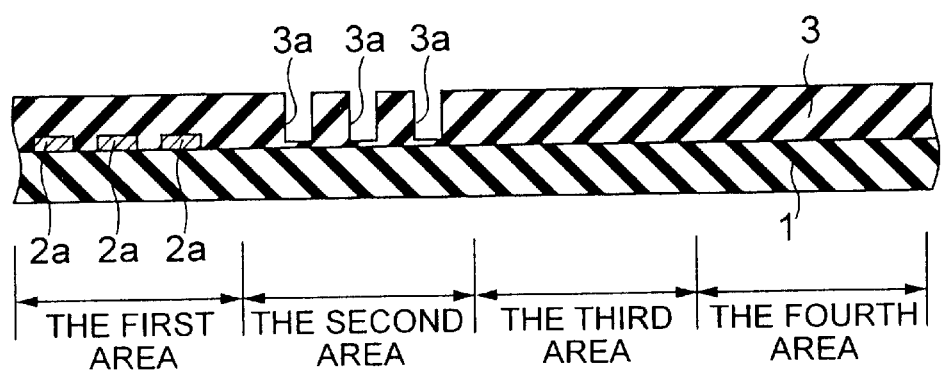
FIGS. 2A through 2G are cross sectional views sequentially showing a method of manufacturing a semiconductor device using an alignment mark of the second prior art.
Figure 2B:
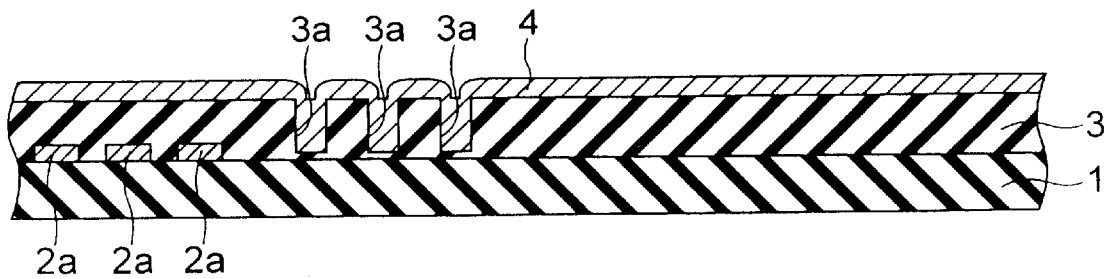
Figure 2C:
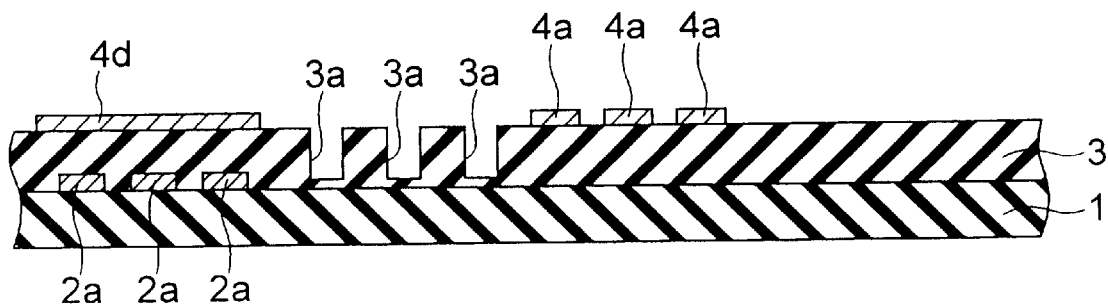
Figure 2D:
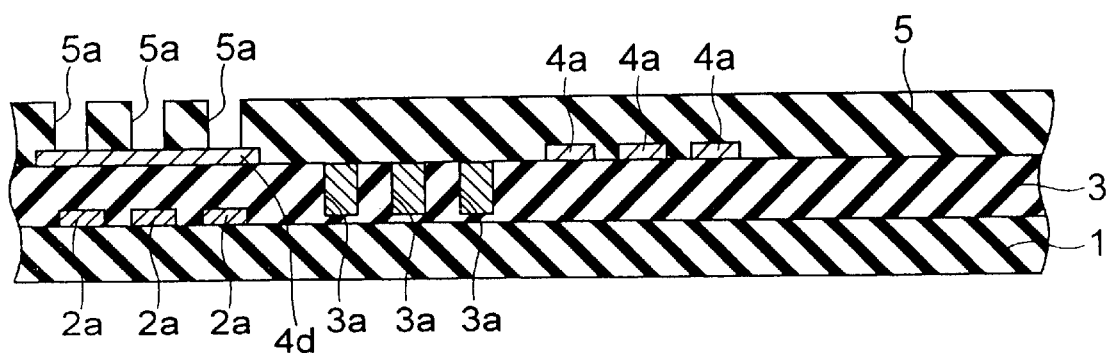
Figure 2E:
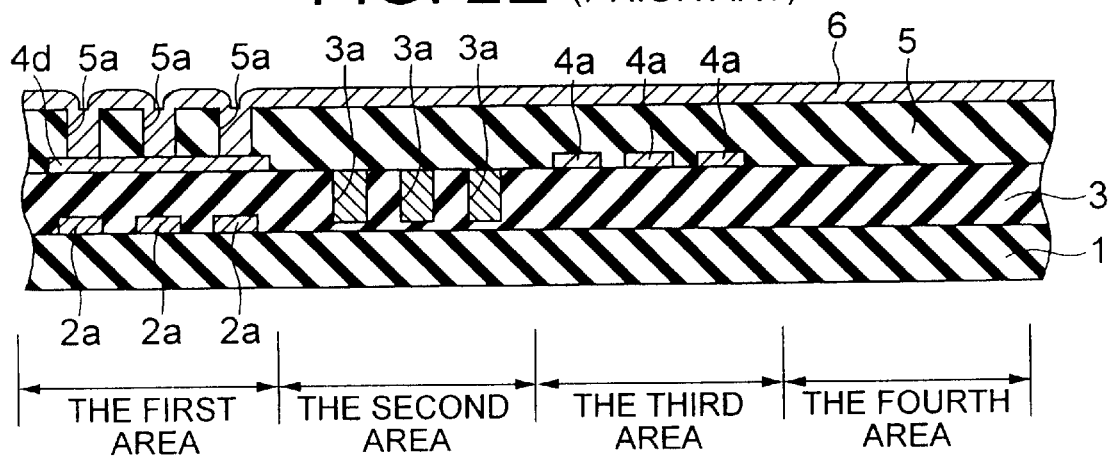
Figure 2F:
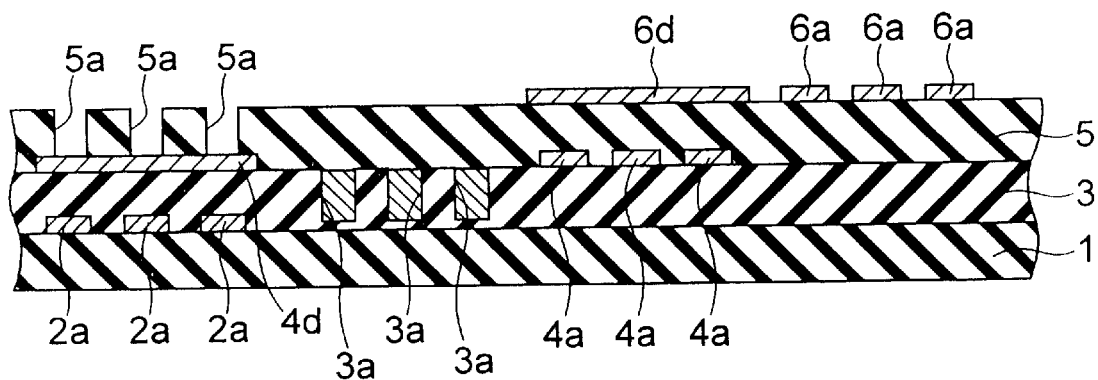
Figure 2G:
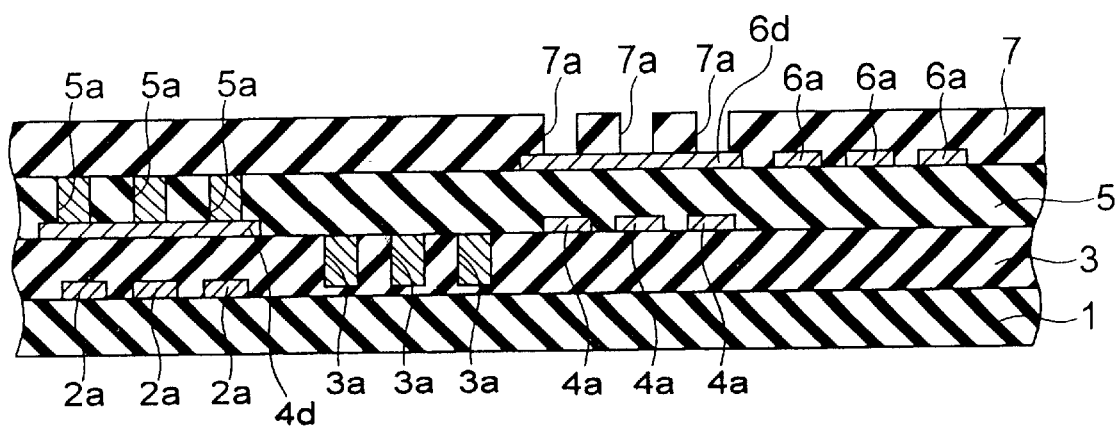
Figure 3:
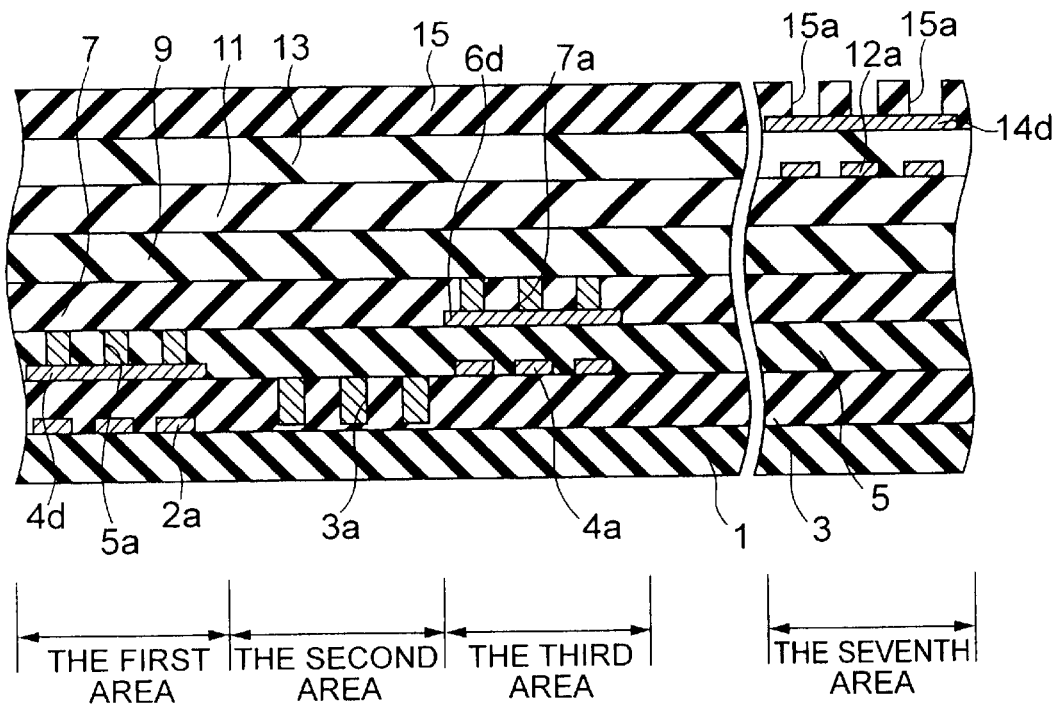
FIG. 3 is a cross sectional view showing the next process of FIG. 2G.
Figure 4A:
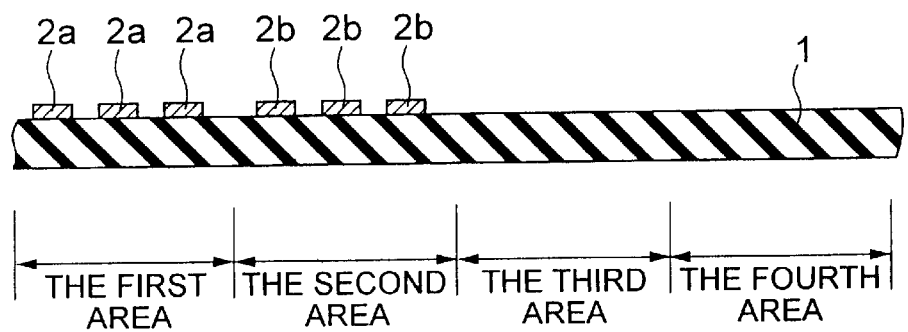
FIGS. 4A through 4H are cross sectional views sequentially showing a method of manufacturing a semiconductor device according to the first embodiment of the present invention.
Figure 5:
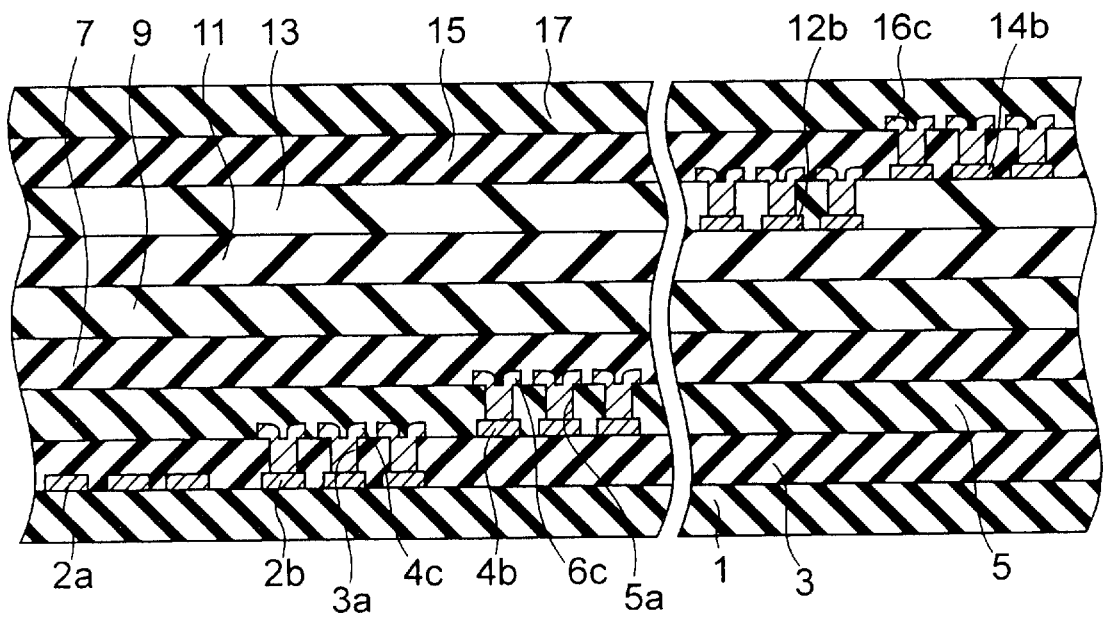
FIG. 5 is a cross sectional view showing the next process of FIG. 4H.
Figure 5:
Figure 6:
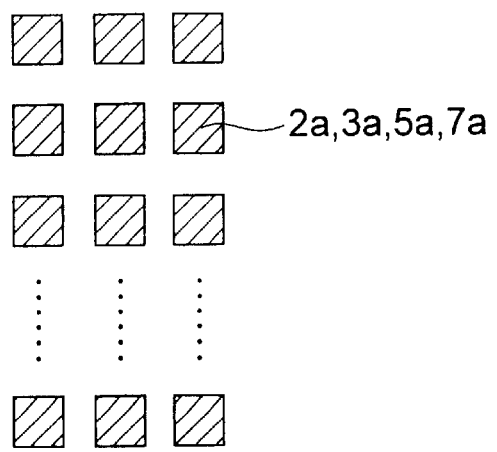
FIG. 6 is a plan view schematically showing the arrangement of the alignment mark used in the present invention.
Figure 7:
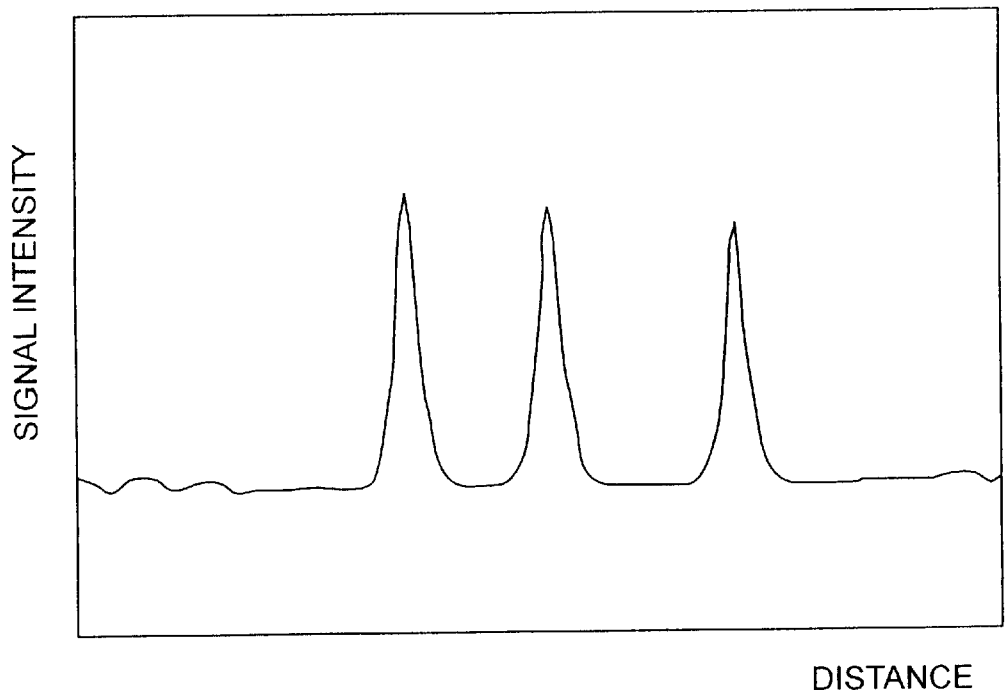
FIG. 7 is a measured data showing an intensity distribution of the laser beam reflected from the alignment mark which is experimentally formed with a sixth wiring layer provided in the seventh area, wherein a vertical axis indicates an intensity of the reflected laser beam and a horizontal axis indicates a length along the scribe line.
Figure 8:
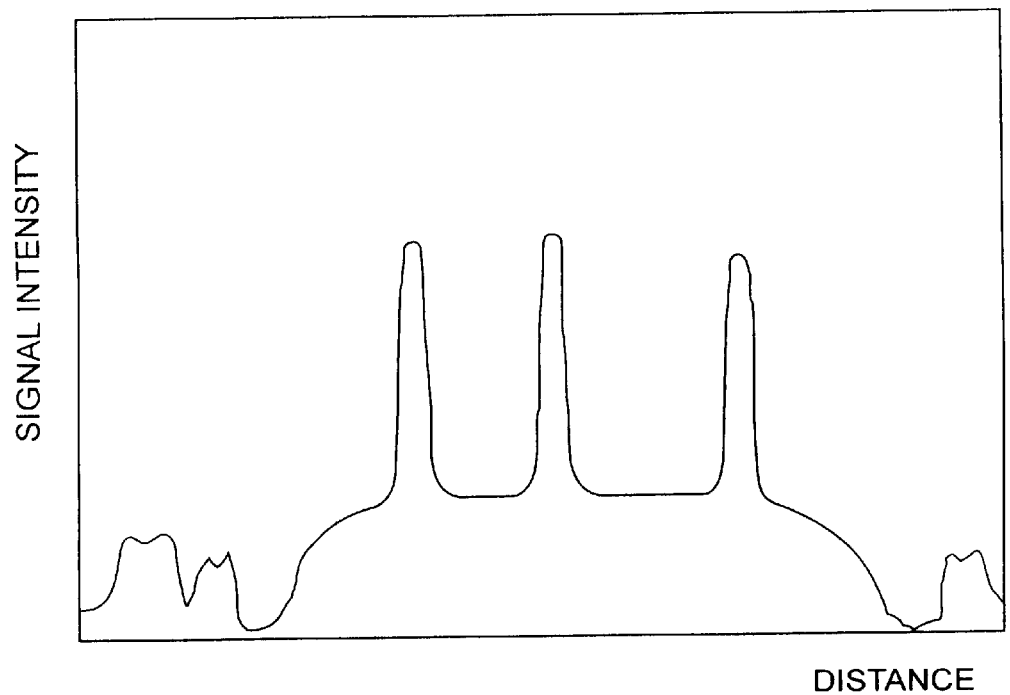
FIG. 8 is a measured data showing an intensity distribution of the laser beam reflected from the alignment mark which is experimentally formed with a first wiring layer, wherein a vertical axis indicates an intensity of the reflected laser beam and a horizontal axis indicates a length along the scribe line.

First, a method of manufacturing a semiconductor device using an alignment mark according to the first embodiment of the present invention will be described with reference to FIGS. 4A through 4H, FIG. 5, FIG. 6, FIG. 7 and FIG. 8. FIGS. 4A through 4H and FIG. 5 are cross sectional views sequentially showing a method of manufacturing a semiconductor device according to the first embodiment of the present invention, and illustrate cross sections of an alignment area such as a scribe line where an alignment marks are formed. Also, FIG. 6 is a plan view schematically showing the arrangement of the alignment mark used in the present invention, and FIGS. 7 and 8 are the measured data showing the intensity distribution of the laser beam for alignment reflected from the alignment mark.

First, a device isolating-insulation layer and a gate electrode are formed on a semiconductor substrate (not shown) such as Si, and a predetermined transistor is formed (not shown). After that, as shown in FIG. 4A, after a first insulating layer 1 comprised of a silicon oxide layer is deposited in the thickness of about 1.3 μm, a through hole is formed in a predetermined area of a circuit pattern area (not shown). Next, after a base metal of Ti/TiN, etc. is deposited in the thickness of about 70 nm by sputtering method, a metal layer of Al, etc. is formed in the thickness of about 400 nm. Subsequently, a resist layer is formed, and an exposure is performed by means of using a mark (not shown) previously formed in the semiconductor substrate as a reference.

And, a dry etching such as plasma etching is performed by means of using a resist pattern formed by the exposure as a mask, so that a first wiring layer (not shown) is formed in the circuit pattern area. At this time, an alignment mark 2a in which the metal layers are arranged in a matrix shape is formed in a first area of an alignment area, and at the same time, a saucer 2b that becomes an underlay of through holes to be formed in the next process is formed in a second area.

In this case, because a shape of the saucer 2b is slightly larger than that of the through hole and saucers are formed to be separated from each other, the metal layer having a large size can be prevented from remaining in the scribe line as the prior art. Further, as explained later, by means of providing a saucer 2b, the thickness of the insulation layer formed in the upper layer thereof can be equal to those of the circuit pattern area and the alignment area, and an uniformity of the alignment mark shapes in a wafer surface can be improved. In addition, as shown in FIG. 6, an alignment mark uses a mark having shape that three columns of marks are arranged in several tens of rows at predetermined intervals.

Figure 4B:
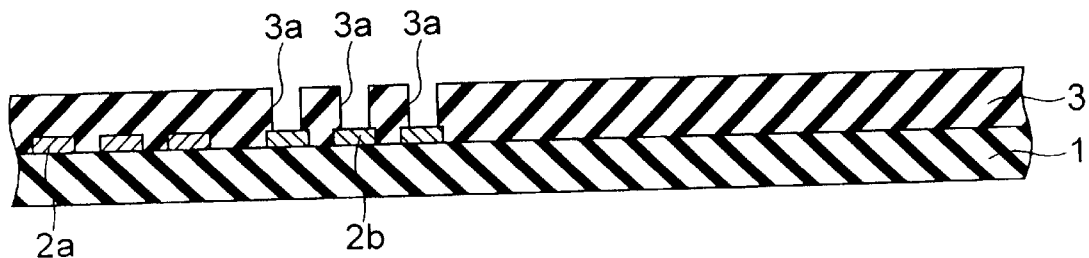

Next, as shown in FIG. 4B, after a silicon oxide layer, etc. are deposited on the first wiring layer, a flattening is performed by Chemical Mechanical Polishing (CMP) process or etchback process, and a silicon oxide layer, etc. are deposited again, so that a second insulation layer 3 of about 1.3 μm in thickness is formed. After that, a predetermined resist layer is formed, and then, an exposure is performed by means of using the alignment mark 2a comprised of the first wiring layer as a reference. A dry etching is performed by using a resist pattern formed by the exposure as a mask, so that first through holes are formed in the circuit pattern area, and at the same time, an alignment mark 3a in which the first through holes are arranged in a matrix shape is formed on the saucer 2b in a second area of the alignment area.

In the first prior art, because the second insulation layer 3 does not have the first wiring layer, the thickness thereof in the alignment area upon opening the first through holes became thicker than that of the circuit pattern area having the first wiring layer, thereby, the etching of the alignment mark 3a was stopped in the middle portion of the second insulation layer 3, however, in the present embodiment, because the saucer 2b formed in the previous process is placed in the lower layer of the second insulation layer 3, the thickness of the second insulation layer 3 is the same as those of the circuit pattern area and the alignment area, so that the second alignment mark 3a is formed by penetrating the second insulation layer. In addition, according to the thickness of the insulation layer forming the through hole, there is a case that a step of the through hole s becomes too smaller to perform an alignment due to a saucer 2b, but in this case, it is unnecessary to form the saucer 2b.

Figure 4C:
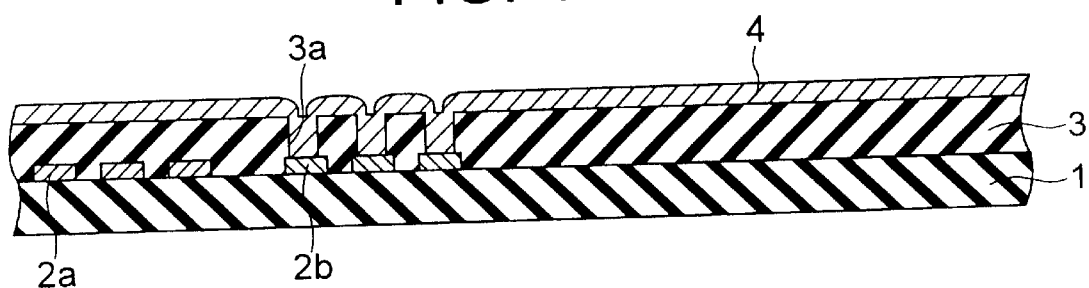
Figure 4D:
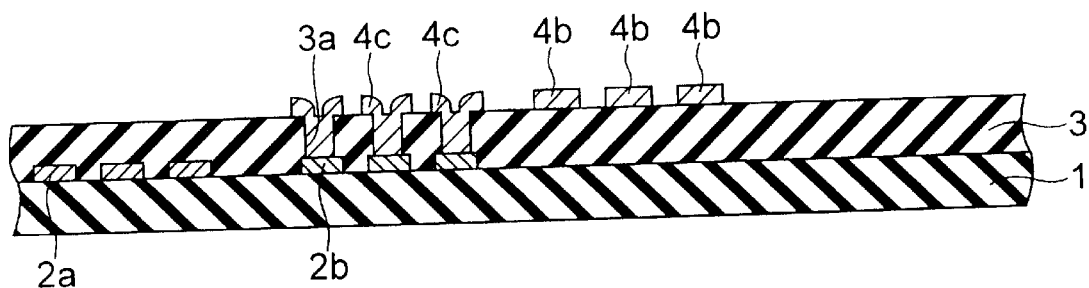

Next, as shown in FIG. 4C, after metal layers (not shown) such as Ti/TiN and Al are deposited on the second insulation layer 3, a resist layer is formed, and then, an exposure is performed by using the alignment mark 3a depositing the metal layers in the first through holes as a reference. At this time, as mentioned in the above, since the alignment mark 3a is formed by penetrating the second insulation layer 3, an uniformity of the alignment mark shape in a wafer surface can be improved, so that an measurement error of the alignment mark can be reduced. And, a dry etching is performed by means of using a resist pattern (not shown) formed by the exposure as a mask, so that a second wiring layer 4 is formed in the circuit pattern area. At this time, as shown in FIG. 4D, a new alignment mark is not formed in the alignment area, but a saucer 4b which becomes an underlay for the through holes of a third insulation 5 to be formed thereon is formed in a third area. Further, a lid 4c pushed out of the through holes may be formed on the alignment mark 3a. The lid 4c can prevent sidewalls comprised of the second wiring layer 4 deposited on the inner walls of the alignment mark 3a from being peeled off.

Figure 4E:
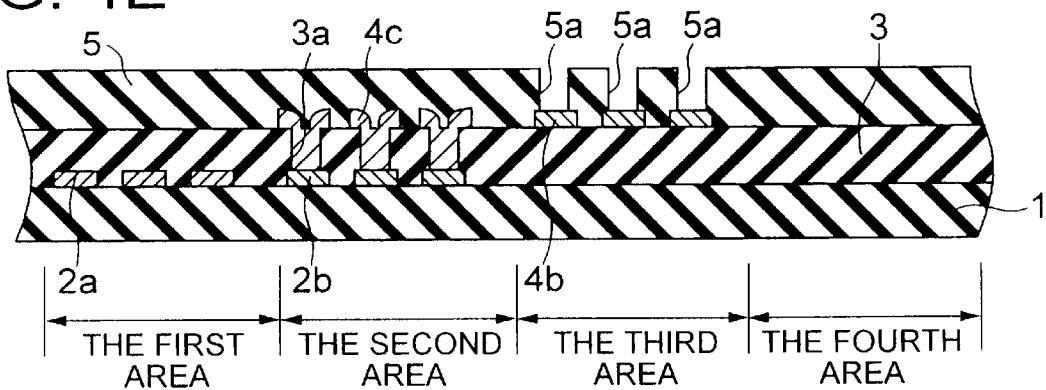

Next, as shown in FIG. 4E, after a third insulation layer 5 comprised of a silicon oxide layer, etc. is deposited in the thickness of about 1.3 μm on the second wiring layer 4, a predetermined resist layer (not shown) is formed, and then, an exposure is performed. Similarly to the case of the second insulation layer 3, in the present embodiment, the alignment mark 2a formed of the first wiring layer in FIG. 4A is used. That is, conventionally, the alignment of the third insulation layer 5 has been performed by using an alignment mark formed of the second wiring layer 4 just under the third insulation layer 5, however in the preferred embodiment, in the present embodiment, since a stacked layer of the third insulation layer 5 and the second insulation layer 3 can sufficiently transmit a laser beam such as He-Ne and a halogen light for the alignment and a metal layer reflecting an alignment light is not formed in the upper part of the first alignment mark 2a, the alignment is performed by using the alignment mark 2a as a reference.

As such, in the present embodiment, the exposure is performed by using the alignment mark 2a as a reference, and a resist pattern having an opening is formed on the saucer 4b formed of the second wiring layer 4, and then, a dry etching is performed by using the resist pattern as a mask, so that the second through holes penetrating the third insulation layer 5 are formed in the circuit pattern area, and the alignment mark 5a in which the second through holes are arranged is formed on the saucer 4b in the third area of the alignment area.

Figure 4F:
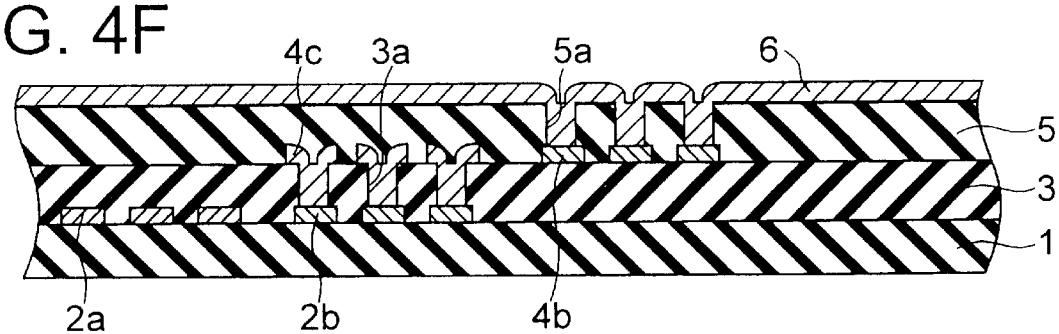
Figure 4G:
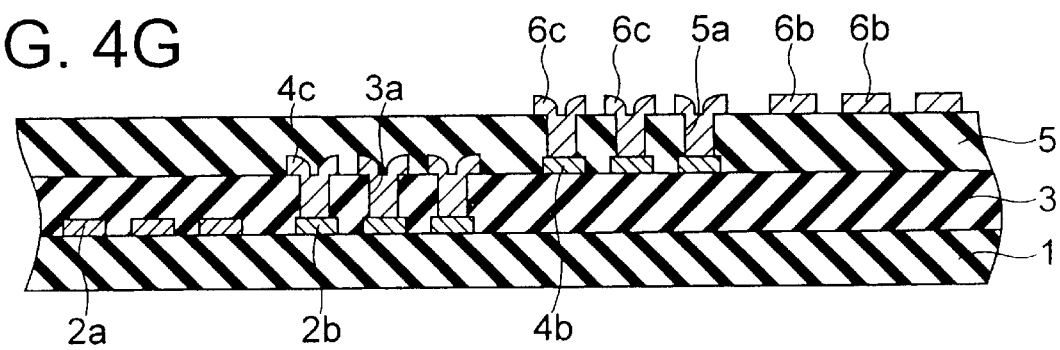
Figure 4H:
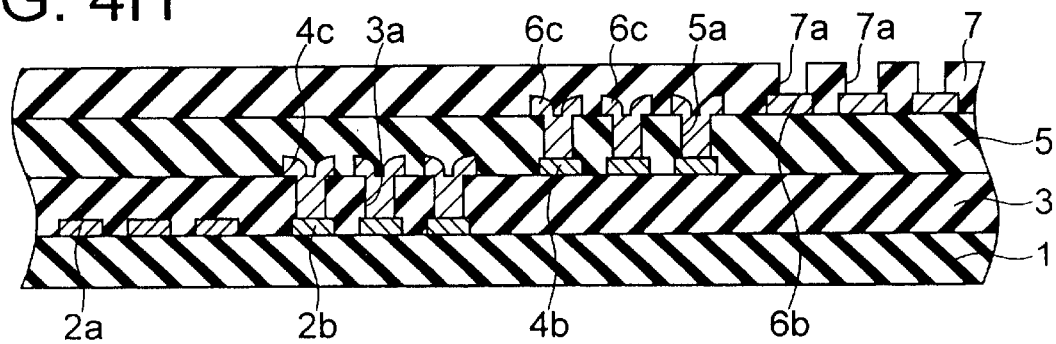

In the same manner, as shown in FIG. 4F, after metal layers such as Ti/TiN and Al are deposited on the third insulation layer 5, a third wiring layer 6 is formed in the circuit pattern area by using the alignment mark 5a comprised of the second through holes formed in the previous process as a reference, and at the same time, as shown in FIG. 4G, a saucer 6b which becomes a underlay of the alignment mark comprised of the through holes to be formed thereon is formed in a fourth area of the alignment area. And, as shown in FIG. 4H, after a fourth insulation layer 7 comprised of a silicon oxide layer, etc. is deposited on the third wiring layer 6, as the process in FIG. 4B, an exposure is performed by using the first alignment mark 2a as a reference, so that an alignment mark 7a in which the third through holes are arranged is formed on the saucer 6b in the fourth area of the alignment area. After that, as shown in FIG. 5, a semiconductor device in which a plurality of wiring layers are stacked in multilayer is manufactured by repeating the same processes.

In this case, in an alignment for forming the through holes of the second to the eighth insulation layers and a protection layer comprised of polyimide of the uppermost layer, it is confirmed that an alignment light such as a laser beam of He-Ne and a halogen light can sufficiently transmit the stacked insulation layers. According to the experiment conducted by the inventor of the present invention, an experimental alignment mark was formed on a sixth wiring layer 12, and the alignment for forming a through hole in a seventh insulation layer 13 was performed by using the alignment mark 2a formed of the first wiring layer and the above-mentioned experimental alignment mark, respectively, and the intensity of the signal from the both alignments was compared. The results thereof are shown in FIG. 7 and FIG. 8.

FIG. 7 and FIG. 8 show an intensity distribution of the alignment lights reflected from the alignment marks, FIG. 7 shows data of the experimental alignment mark formed of the sixth wiring layer 12 shown in the seventh area, and FIG. 8 shows data of the alignment mark 2a formed of the first wiring layer. Further, in FIG. 7 and FIG. 8, a horizontal axis indicates a distance on a scribe line, and a vertical axis indicates an intensity of the reflected light. On comparing the both, in FIG. 8, although the alignment light is a waveform after passing through six layers of the second to the seventh insulation layers, the waveform of the reflected light is not different from that of FIG. 7 transmitting only the seventh insulation layer, and it can be known that the alignment can be performed by using only the alignment mark 2a formed of the first wiring layer.

The waveform of reflected right is dependent on the conditions such as materials and thickness of the insulation layers to which the light is transmitted, but the inventor of the present invention have confirmed that the first alignment mark 2a can be used in manufacturing a semiconductor device having the structure depositing eight layers of Ti/TiN and Al as a wiring layer, depositing silicon oxide layers of about 1.3 μm in thickness as an insulation layer between the wiring layers, and depositing a protection layer comprised of polyimide on the uppermost surface.

As such, according to a method of manufacturing a semiconductor device using an alignment mark of the present embodiment, since the through holes can be formed in all the insulation layers deposited in the upper layer of the first wiring layer by using the alignment mark 2a formed in processing the first wiring layer, it is unnecessary to form new alignment marks on each wiring layer, and the number of alignment marks can be reduced comparing to the prior art. Consequently, the alignment area can be reduced, and other accessory or a check pattern for confirming an operation, etc. can be arranged. Further, since it is unnecessary to form a metal layer such as a light-shielding layer having large size unlike the prior art, in case where an alignment area is formed in a scribe line, there is no possibility that short occurs due to scattering of metal pieces during dicing process. The above-mentioned effect is achieved in case of providing three or more wiring layers, and the more layers are provided, the more effects are exhibited, but according to the experiment conducted by the inventor of the present invention, it has been confirmed that a semiconductor device in which eight wiring layers are stacked can be manufactured by using the above-mentioned method.

Further, although the present embodiment described the case using Ti/TiN and Al as a material of the wiring layer, and a silicon oxide layer as a material of the insulation layer, the present invention is not limited to the above-mentioned embodiment, and other conductive materials such as tungsten can be used as a wiring layer, and a silicon nitride layer, a stacked layer consisted of a silicon oxide layer and a silicon nitride layer, SOG and other insulating materials can be used as an insulation layer.

Second Embodiment

Next, a method of manufacturing a semiconductor device using an alignment mark according to a second embodiment of the present invention will be discussed with reference to FIGS. 9A through 9J, FIG. 10A and FIG. 10B. FIGS. 9A through 9J, FIG. 10A and FIG. 10B are cross sectional views sequentially showing a method of manufacturing the semiconductor device according to the second embodiment, and illustrate a configuration of an alignment area such as a scribe line where alignment marks are formed. Further, the present embodiment is different from the first embodiment in view that the through holes in the insulation layers are formed by being alternately stacked so as to more reduce the area occupied by the alignment mark, and other conditions are the same as those of the first embodiment.

Figure 9A:
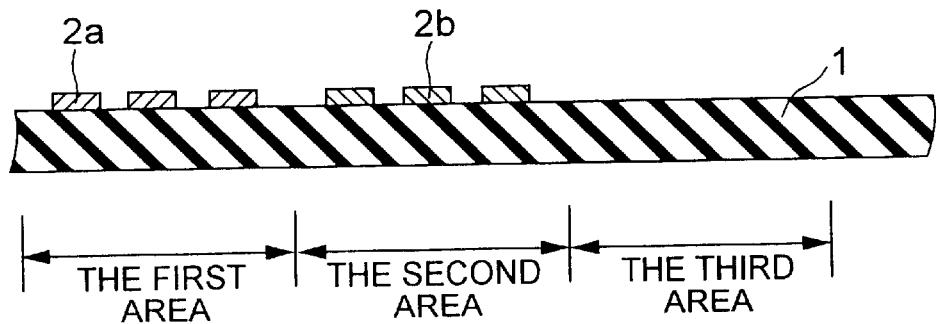
FIGS. 9A through 9J are cross sectional views sequentially showing a method of manufacturing a semiconductor device according to the second embodiment of the present invention.

First, in the same manner as the first embodiment, as shown in FIG. 9A, a device isolating-insulation layer and a gate electrode are formed on a semiconductor substrate (not shown) such as Si, and then, a first insulation layer 1 comprised of a silicon oxide layer, etc. is deposited in the thickness of about 1.3 μm thereon. Next, after metal layers such as Ti/TiN and Al are deposited in the thickness of about 70 μm and 400 μm, respectively, by using a mark (not shown) previously formed in the semiconductor substrate as a reference, a first wiring layer (not shown) is formed in a circuit pattern area, and at the same time, a first alignment mark 2a d is formed in a first area of an alignment, and a saucer 2b which becomes an underlay of through holes formed in the next process is formed in a second area of an alignment area.

Figure 9B:
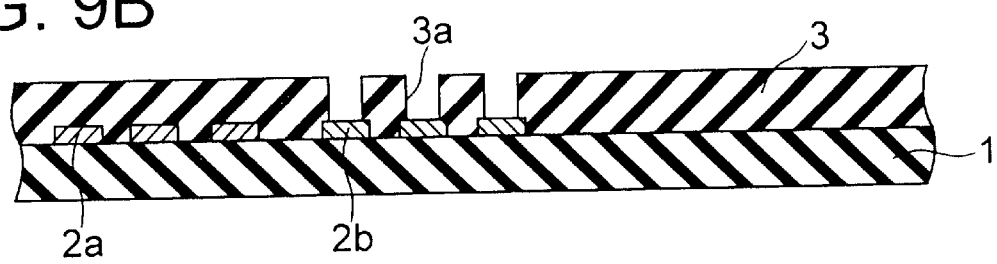

Next, as shown in FIG. 9B, a second insulation layer 3 comprised of a silicon oxide layer, etc. is deposited on the first wiring layer, and a flattening is performed by CMP process or etchback process so as to be about 1.3 µm in thickness, and then, by using the first alignment mark 2a as a reference, first through holes are formed in the circuit area, and at the same time, an alignment mark 3a in which the first through holes are arranged in a matrix shape is formed on the saucer 2b in the second area of the alignment area.

Figure 9C:
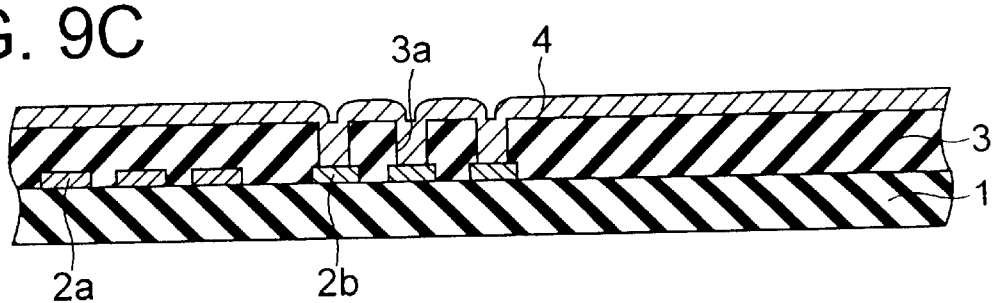
Figure 9D:
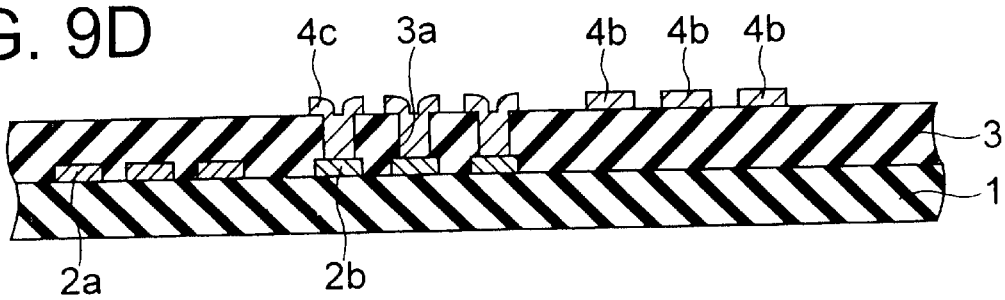

Next, as shown FIGS. 9C and 9D, after a metal layer such as Al is deposited on the second insulation layer 3, an exposure is performed by means of using the alignment mark 3a as a reference, so that a second wiring layer 4 is formed in the circuit pattern area, and at the same time, a saucer 4b which becomes an underlay of through holes in the third insulation layer 5 to be formed thereon is formed in a third area, and a lid 4c pushed out of the first through holes is formed in the second area.

Figure 9E:
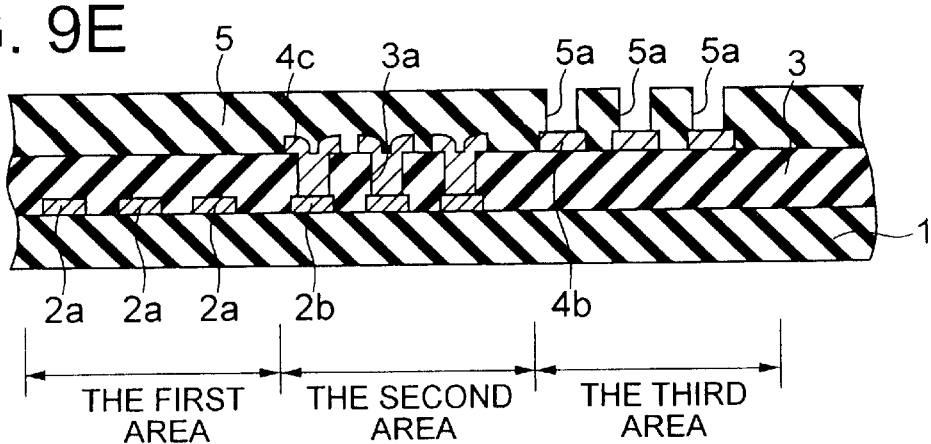
Figure 9F:
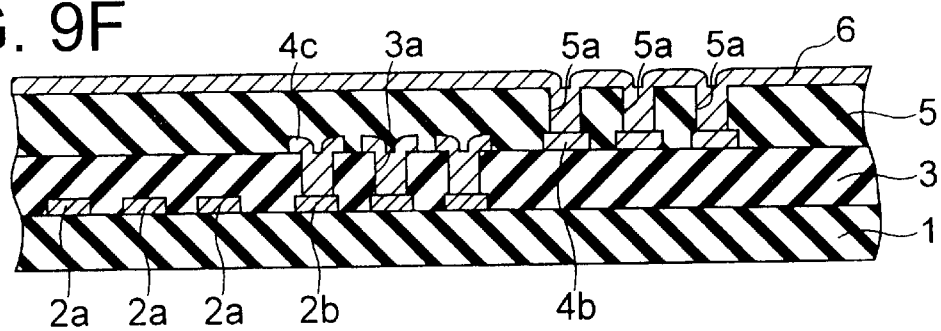

Next, as shown in FIGS. 9E and 9F, after a third insulation layer 5 is deposited on the first wiring layer, in the same manner as the above-mentioned first embodiment, an exposure is performed by means of using the alignment mark 2a formed of the first wiring layer as a reference, so that second through holes penetrating the third insulation layer 5 are formed by in the circuit pattern area, and at the same time, an alignment mark 5a in which the second through holes are arranged is formed on the saucer 4b in the third area. After that, a metal layer such as Al is deposited on the third insulation layer 5.

Figure 9G:
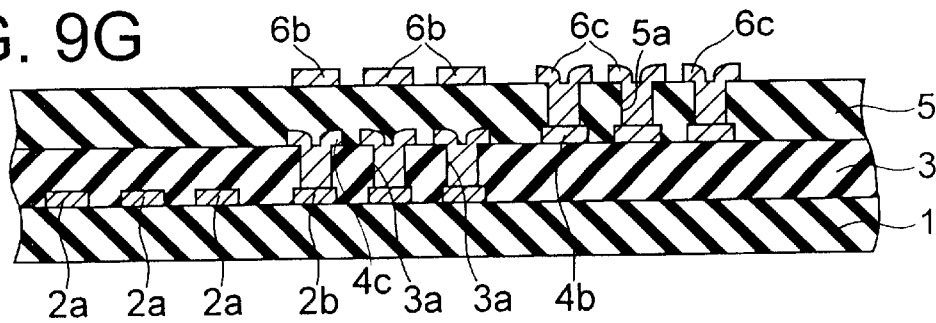

Subsequently, a third wiring layer 6 is formed by using the alignment mark 5a comprised of the second through holes formed in the previous process as a reference. However, as shown in FIG. 9G, in the present embodiment, unlike the first embodiment, a saucer 6b which becomes an underlay of alignment mark comprised of the through holes to be formed thereon is formed by being overlapped with the second area of a scribe line and the like in which the saucer formed of the first wiring layer is arranged.

Figure 9H:
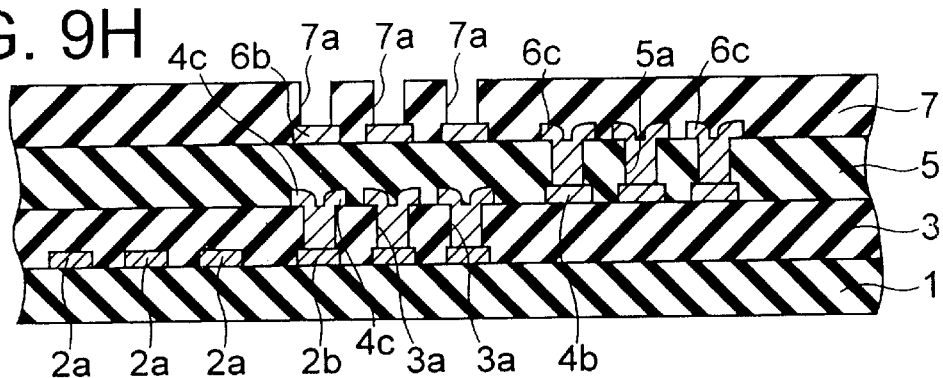
Figure 9I:
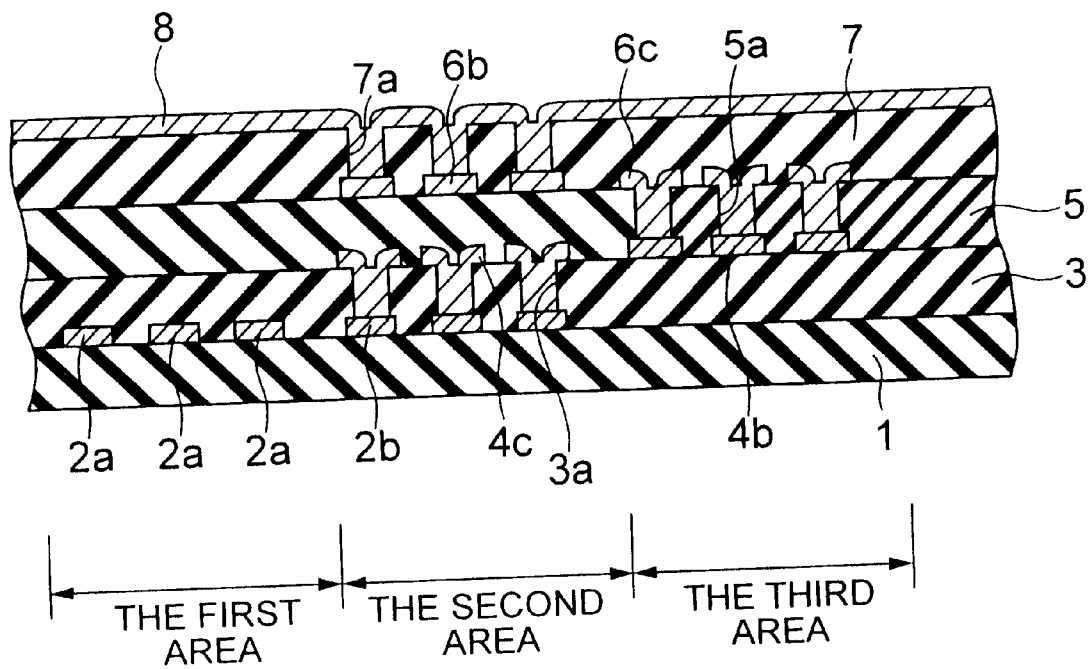
Figure 9J:
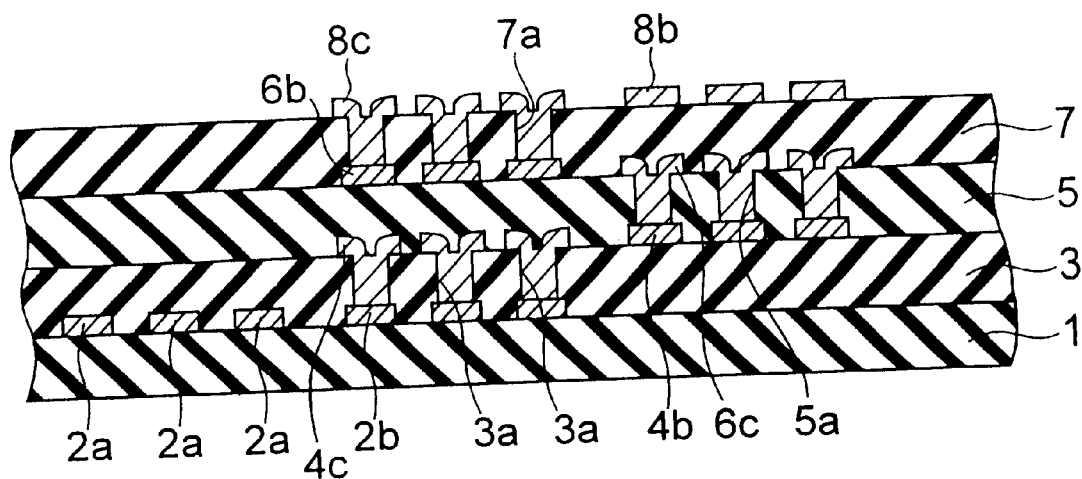
Figure 10A:
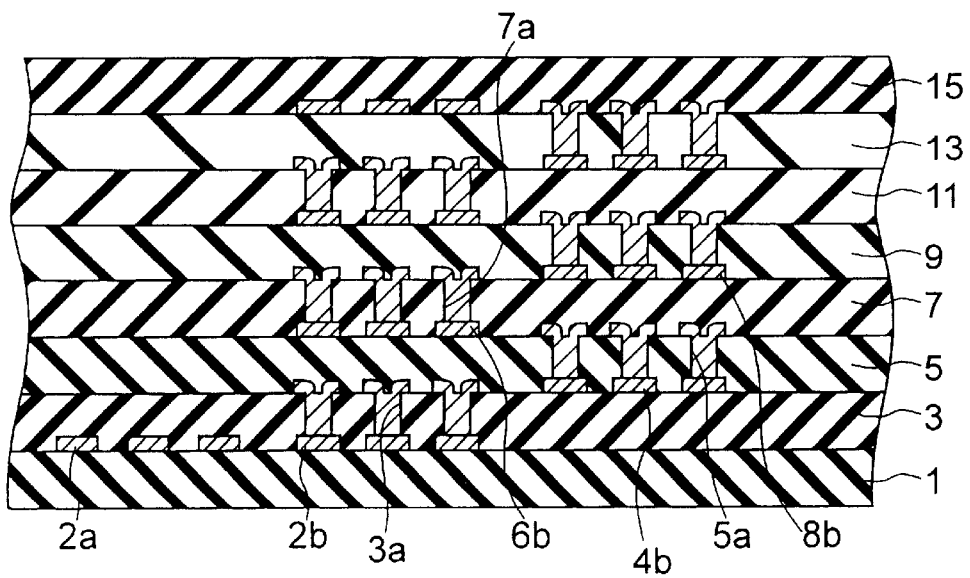
FIG. 10A is a cross sectional view sequentially showing the next process of FIG. 9J.

Next, as shown in FIG. 9H, after a fourth insulation layer 7 is deposited on the third wiring layer 6, as the process in FIG. 9E, an exposure is performed by means of using the alignment mark 2a as a reference, so that third through holes are formed in the circuit pattern area, and at the same time, an alignment mark 7a in which the third through holes are arranged is formed on the saucer 6b in the second area of the alignment area. After that, as shown in FIGS. 9I and 9J, after a metal layer such as Al is deposited on the fourth insulation layer 7, an exposure is performed by means of using the alignment mark 7a as a reference, so that a fourth wiring layer 8 is formed in the circuit pattern area, and at the same time, a saucer 8b which becomes an underlay of through holes in a fifth insulation layer to be formed thereon and a lid 8c pushed out of the third through holes are formed in the third area of the alignment area. As shown in FIG. 10A, a semiconductor device in which a plurality of wiring layers are stacked in multilayer can be manufactured by repeating the same processes.

In this case, although the third through holes are formed by being overlapped on the first through holes, since the saucer 6b is formed in the lower part of the third through holes, the saucer 6b becomes an etch stopper although a dry etching for forming the third through holes is performed excessively, and thus, the third through holes are never connected to the third through holes of the lower layer. Further, when performing the alignment for forming a fourth wiring layer 8, since the wiring layer metal covers all the substrate, the alignment mark 3a comprised of the first through holes of the lower layer or the second wiring layer 4 formed in the first through holes does not become an obstacle to the alignment.

Figure 10B:
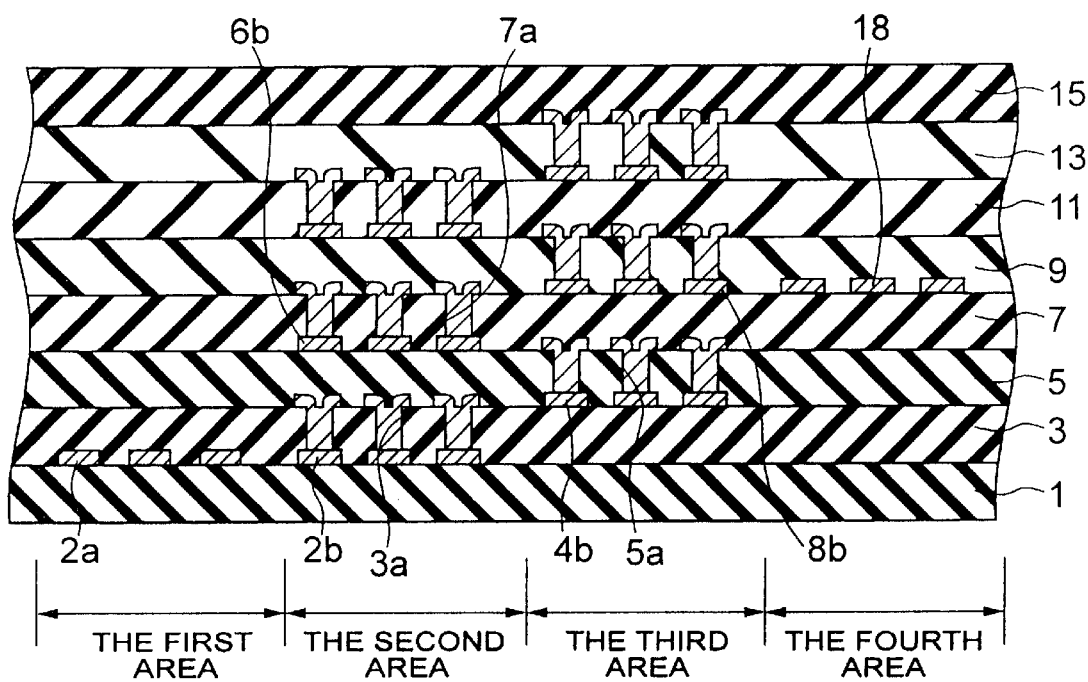
FIG. 10B is a cross sectional view showing a modified embodiment of the second embodiment of the present invention.

In addition, although a plurality of insulation layers are stacked, since a laser beam for alignment sufficiently transmit the insulation layers, similarly to the above-mentioned first embodiment, an alignment for forming the through holes in the insulation layer of the upper layer can be performed by using the alignment mark 2a comprised of the first wiring layer as a reference. Further, in case where it is difficult to detect the alignment light according to a material or thickness of an insulation layer, as shown in FIG. 10B, a preliminary alignment mark 18 is formed on any wiring layer (the fourth wiring layer 9 in FIG. 10B), so that it may be used instead of the alignment mark 2a.

In this manner, according to a method of manufacturing the semiconductor device using an alignment mark of the present embodiment, since the through holes are formed in all the insulation layers deposited above the first wiring layer by using the alignment mark 2a formed when processing the first wiring layer and the through holes are formed alternately at a position overlapped with the through holes in the lower layer, the number of alignment marks and an area occupied by the alignment mark can be more reduced than that of the above-mentioned first embodiment. Thus, a chip size can be effectively utilized, and other accessory or a check pattern for confirming an operation can be arranged.

Third Embodiment

Next, a method of manufacturing a semiconductor device using an alignment mark according to the third embodiment of the present invention will be discussed with reference to FIGS. 11A through 11L. FIG. 11A through FIG. 11L are cross sectional views sequentially showing a method of manufacturing a semiconductor device according to the third embodiment, and illustrate a configuration of a scribe line area where alignment marks are formed. Further, the present embodiment is different from the above-mentioned second embodiment in view that through holes of insulation layers are formed by being sequentially stacked in three areas, and other conditions are the same as those of the second embodiment.

First, in the same manner as the above-mentioned second embodiment, as shown in FIGS. 11A through 11E, a first insulation layer 1, a first wiring layer, an alignment mark 2a and a saucer 2b, an alignment mark 3a comprised of a second insulation layer 3 and first through holes, a second wiring layer 4 and a saucer 4b, and an alignment mark 5a comprised of a third insulation layer 5 and second through holes are formed on a semiconductor substrate (not shown) such as Si.

Figure 11A:
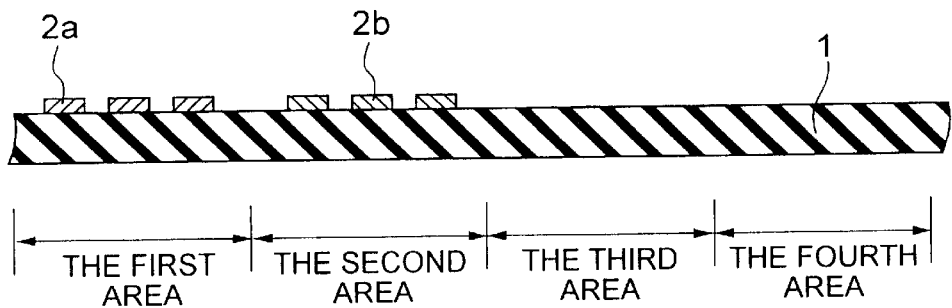
FIGS. 11A through 11L are cross sectional views sequentially showing a method of manufacturing a semiconductor device according to the third embodiment of the present invention.
Figure 11B:
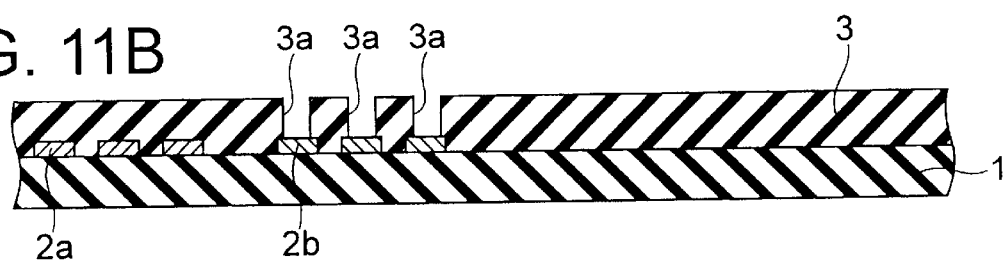
Figure 11C:
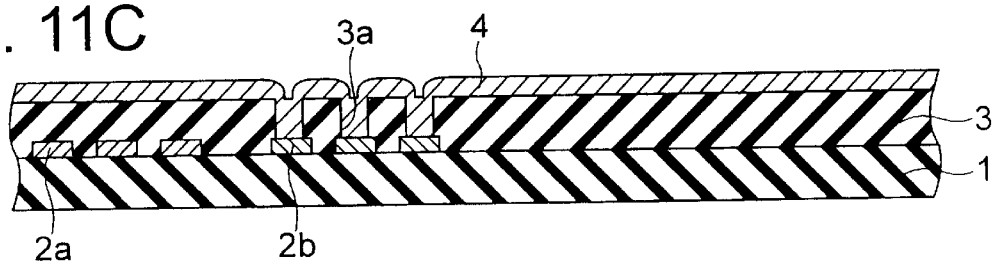
Figure 11D:
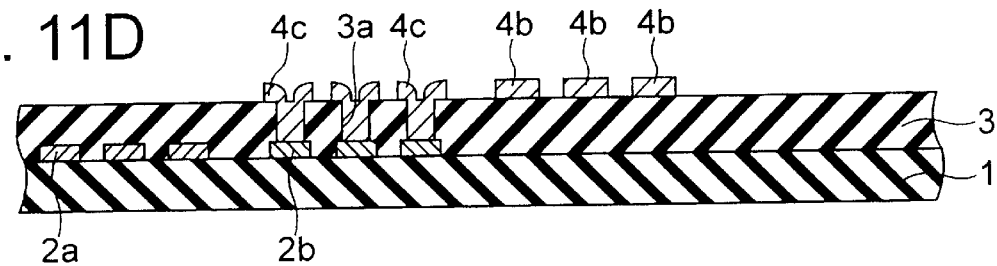
Figure 11E:
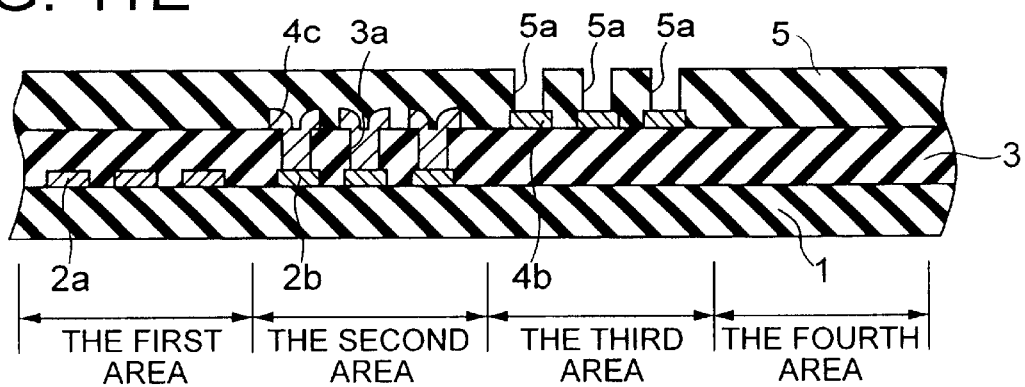
Figure 11F:
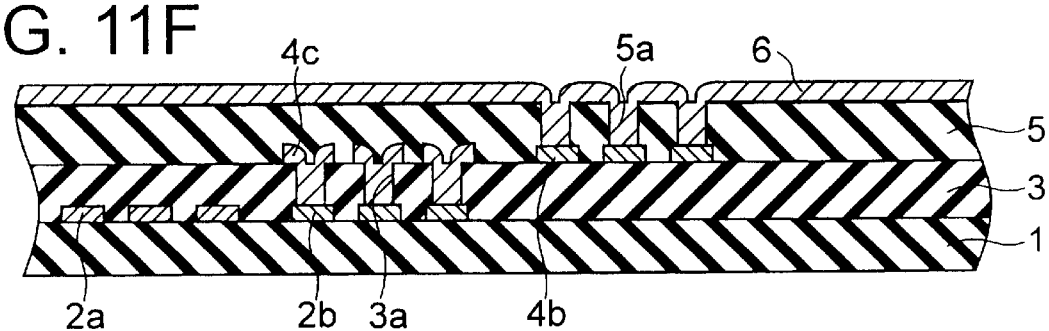
Figure 11G:
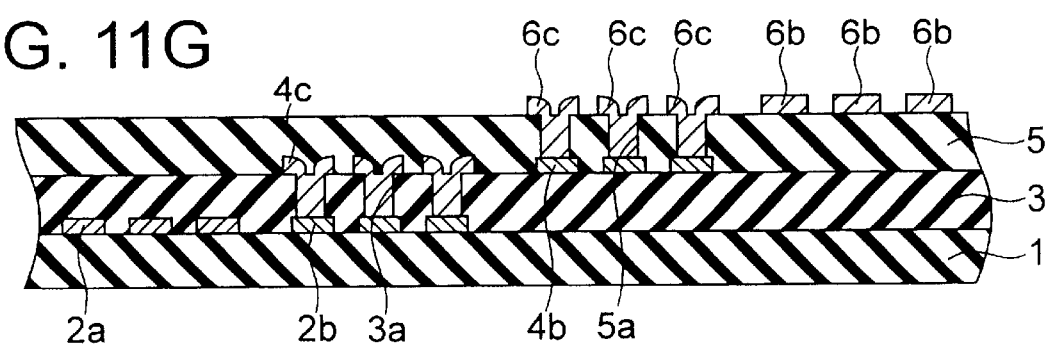
Figure 11H:
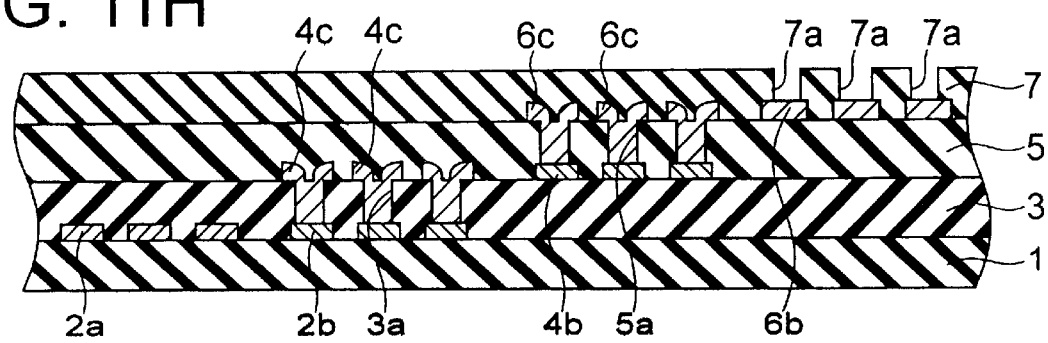

Next, as shown in FIG. 11F, after metal layers such as Ti/TiN and Al are deposited in the thickness of about 70 nm and 400 nm, respectively, a third wiring layer 6 is formed by using the alignment mark 5a comprised of the second through holes as a reference, but in the present embodiment, unlike the second embodiment, as shown in FIG. 11G, a saucer 6b which becomes an underlay of an alignment mark comprised of through holes to be formed thereon is formed in a fourth area of an alignment area. Further, as shown in FIG. 11H, after a fourth insulation layer 7 is deposited on the third wiring layer 6, similarly to the above-mentioned first and second embodiments, an exposure is performed by using the first alignment mark 2a as a reference, so that an alignment mark 7a in which the third through holes are arranged is formed on the saucer 6b in the fourth area of the scribe line.

Figure 11I:
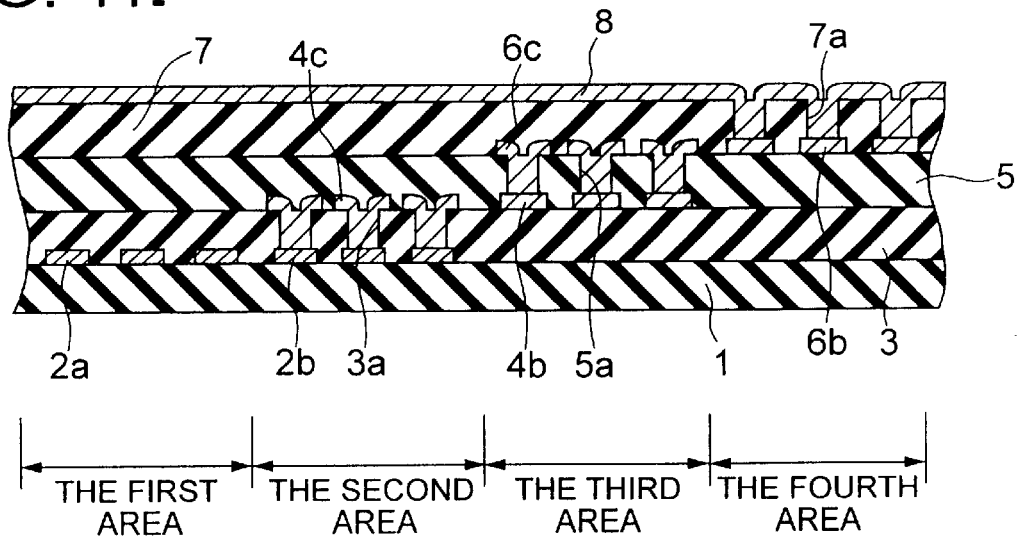
Figure 11J:
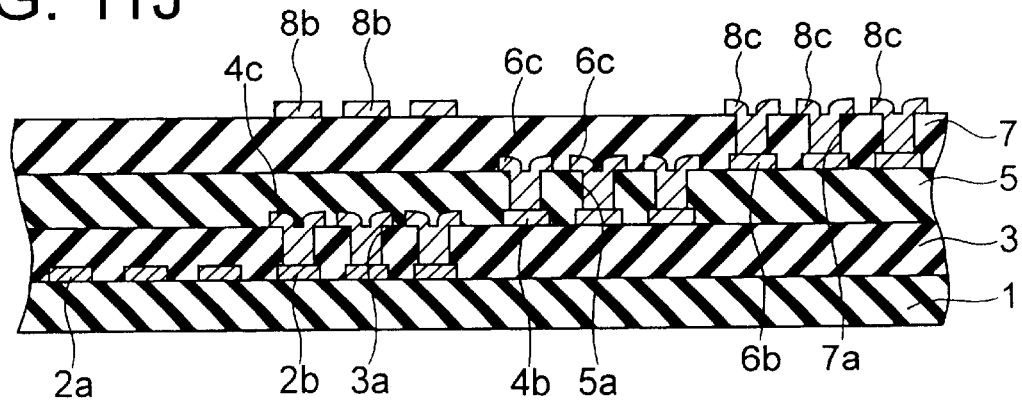
Figure 11K:
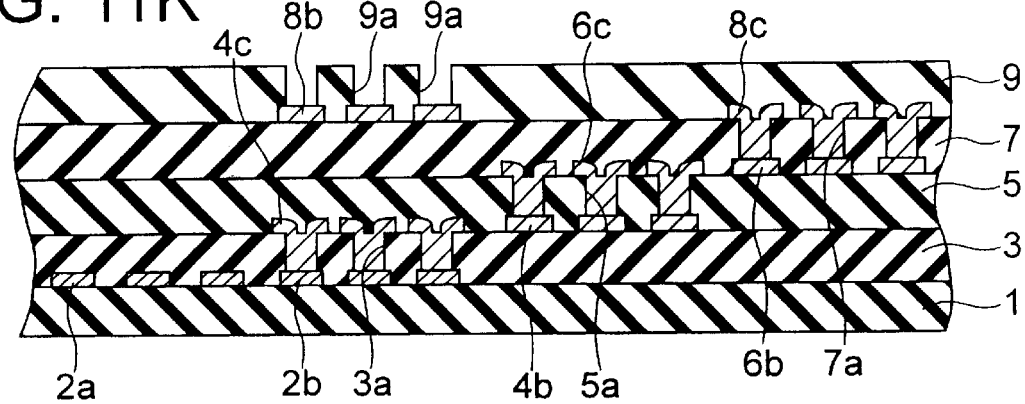
Figure 11L:
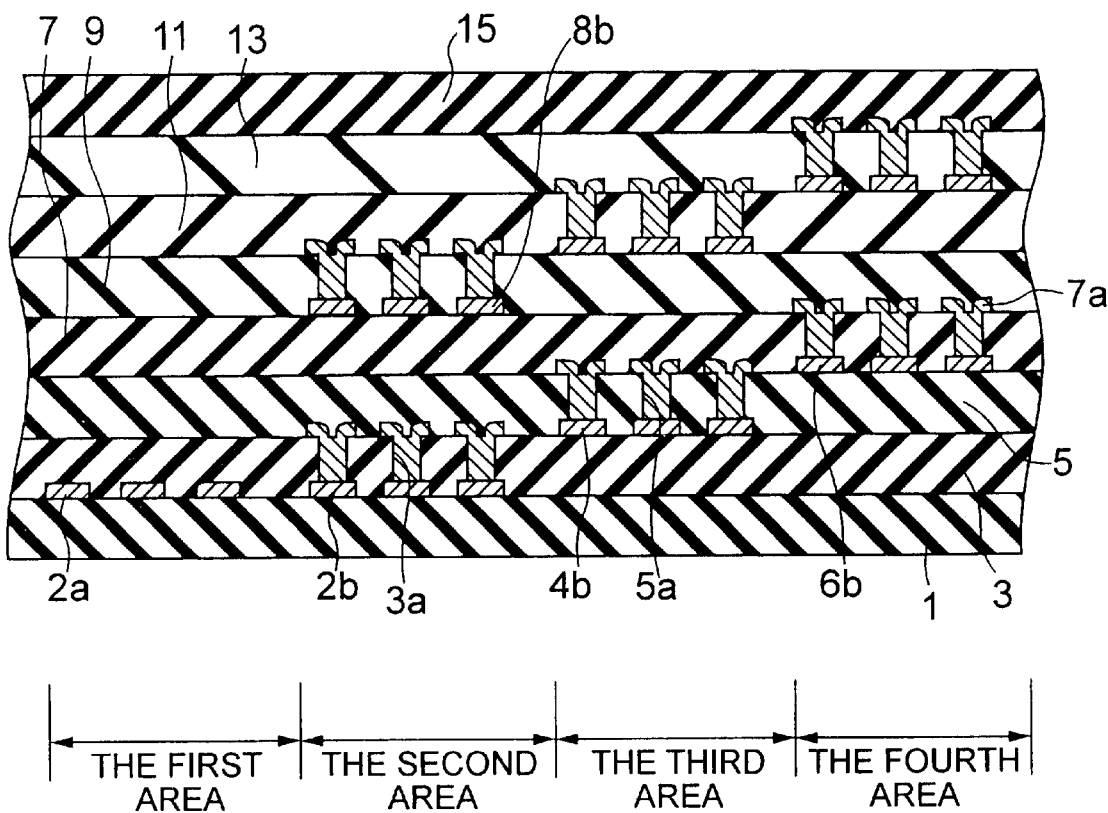

After that, as shown in FIGS. 11I and 11J, after a metal layer of Al, etc. is deposited on the fourth insulation layer 7, an exposure is performed by using the alignment mark 7a as a reference, so that a saucer 8b which becomes an underlay of through holes of the fourth insulation layer 9 to be formed thereon and a lid 8c pushed out of the third through holes are formed in the second area of the alignment area. As shown in FIG. 11L, a semiconductor device in which a plurality of wiring layers are stacked in multilayer can be manufactured by repeating the same processes.

In this case, in the present embodiment, the through holes are formed by being overlapped in three areas sequentially, and it is because in case where according to a thickness of each insulation layer, unevenness in the lid for preventing sidewalls formed in the through holes from being peeled off is reflected on the saucer in the upper layer thereof, so that the shape of through holes may be disordered, thereby, in this case, an affect caused by the unevenness is relieved by forming more insulation layers inserted between the upper and lower through holes. Accordingly, an area where the through holes are formed is three in the present embodiment, but the number of the areas can be properly increased according to the manufacturing conditions.

In addition, although a plurality of insulation layers is stacked, since the alignment light sufficiently transmits the insulation layers, similarly to above-mentioned first and second embodiment, the alignment mark 2a formed of the first wiring layer is used as a reference when forming the through holes in the upper insulation layer. Further, in case where it is difficult to detect the alignment light according to a material or thickness of an insulation layer, similarly to the second embodiment, a preliminary alignment mark may be provided on any wiring layer.

In this manner, according to a method of manufacturing a semiconductor device using an alignment mark of the present embodiment, the through holes are formed in all the insulation layers deposited on the first wiring layer by using the alignment mark 2a formed of the first wiring layer, and the through holes are formed in three areas at a position sequentially overlapped with the through holes in the lower layer, thereby, comparing to the prior art that a new alignment mark is formed in each wiring layer, the number of the alignment marks and the area occupied by the alignment mark can be more reduced.

Although the technical spirits of the present invention has been disclosed with reference to the appended drawings and the preferred embodiments of the present invention corresponding to the drawings, the descriptions in the present specification are only for illustrative purpose, not for limiting the present invention.

Also, those who are skilled in the art will appreciate that various modifications, additions and substitutions are possible without departing from the scope and spirit of the present invention. Therefore, it should be understood that the present invention is limited only to the accompanying claims and the equivalents thereof, and includes the aforementioned modifications, additions and substitutions.

What is claimed is:

1. A method of manufacturing a semiconductor device having a multilayer wiring structure in which wiring layers and insulation layers are alternately stacked, said method comprising:

forming a wiring layer on an underlying insulation layer, said wiring layer being aligned using an alignment mark formed of a plurality of through holes provided in said underlying insulation layer; and forming an overlying insulation layer on said wiring layer, said overlying insulation layer comprising a plurality of through holes being aligned using an alignment mark provided in a lowermost wiring layer.

2. The method of manufacturing a semiconductor device according to claim 1, further comprising:

concurrently with said forming said wiring layer, forming an underlay having a larger shape than that of said through holes in said overlying insulation layer at a position which is aligned to each through hole of said alignment mark formed in said overlying insulation layer.

3. The method of manufacturing a semiconductor device according to claim 1, further comprising:

etching said wiring layer so as to form a convex portion extended outwardly from an inner wall on an upper edge of each through hole of said alignment mark formed in said underlying insulation layer.

4. The method of manufacturing a semiconductor device according to claim 1, wherein said alignment marks formed in each of said insulation layers are sequentially formed in two or three areas within said predetermined alignment area, and said alignment marks in each area are arranged so as to be overlapped with each other as seen in a normal direction to the substrate.

5. The method of manufacturing a semiconductor device according to claim 1, wherein said insulation layer is formed of a silicon oxide layer or a polyimide, and at least three layers of said wiring layers are formed.

6. The method of manufacturing a semiconductor device according to claim 1, wherein said alignment marks are provided in a scribe line area.

7. A method of manufacturing a semiconductor device having a multilayer wiring structure in which wiring layers and insulation layers are alternately stacked, said method comprising:

forming a lowermost wiring layer on a first insulation layer, said lowermost wiring layer comprising a first alignment mark; and forming alternating insulation layers and wiring layers on said lowermost wiring layer, each of said insulation layers comprising a plurality of through holes which are aligned using said first alignment mark, and each of said wiring layers being aligned using said plurality of through holes in an immediately underlying insulation layer.

8. A method of manufacturing a semiconductor device having a multilayer wiring structure in which wiring layers and insulation layers are alternately stacked, said method comprising:

forming a first wiring layer on a first insulation layer, said first wiring layer comprising a first alignment mark and a first underlay;

forming a second insulation layer on said first wiring layer, said second insulation layer comprising a second alignment mark comprising a through hole formed over said first underlay, said through hole being aligned using said first alignment mark;

forming a second wiring layer on said second insulation layer, said second wiring layer comprising a second underlay, and said second wiring layer being aligned using said second alignment mark; and forming a third insulation layer on said second wiring layer, said third insulation layer comprising a third alignment mark comprising a through hole formed over said second underlay, said through hole being aligned using said first alignment mark.

9. The method of manufacturing a semiconductor device according to claim 8, further comprising:

forming a third wiring layer on said third insulation layer, said third wiring layer comprising a third underlay, and said third wiring layer being aligned using said third alignment mark.

10. The method of manufacturing a semiconductor device according to claim 9, further comprising:

forming a fourth insulation layer on said third wiring layer, said fourth insulation layer comprising a fourth alignment mark comprising a through hole formed over said third underlay, said through hole being aligned using said first alignment mark.

11. The method of manufacturing a semiconductor device according to claim 8, wherein said second insulation layer has a thickness of about 1.3 $\mu$m.

12. The method of manufacturing a semiconductor device according to claim 8, wherein said first underlay and said second underlay each comprise a plurality of saucers which are separately formed.

13. The method of manufacturing a semiconductor device according to claim 8, wherein said first alignment mark comprises metal layers arranged in a matrix shape.

14. The method of manufacturing a semiconductor device according to claim 8, wherein said second alignment mark is formed by penetrating said second insulation layer.

15. The method of manufacturing a semiconductor device according to claim 8, further comprising:

forming an uppermost protection layer comprising polyimide.

16. The method of manufacturing a semiconductor device according to claim 8, where in an alignment light comprising a He-Ne laser beam is transmitted through stacked insulation layers in said multilayer wiring structure.

17. A method of manufacturing a semiconduct device having a multilayer wiring structure in which wiring layers and insulation layers are alternately stacked, and aligned by using a plurality of sub-area portions of a predetermined alignment area, comprising:

performing the alignment of said wiring layers with respect to said insulation layer by using an alignment mark formed of a plurality of through holes provided in a predetermined one of said plurality of sub-area portions other than a first sub-area portion of said predetermined alignment area of said insulation layer immediately under said wiring layer to form said wiring layer; and performing an alignment of each of said insulation layers with respect to each of said wiring layers by using an alignment mark provided in a first sub-area portion of said plurality of sub-area portions of said predetermined alignment area of a lowermost wiring layer to form the through holes in each of said insulation layers.

* * * * *